United States Patent
Lewis et al.

(10) Patent No.: US 11,734,468 B2
(45) Date of Patent: *Aug. 22, 2023

(54) SYSTEM AND METHOD FOR GENERATING COMPUTERIZED MODELS OF STRUCTURES USING GEOMETRY EXTRACTION AND RECONSTRUCTION TECHNIQUES

(71) Applicant: Xactware Solutions, Inc., Lehi, UT (US)

(72) Inventors: Jeffery D. Lewis, Orem, UT (US); Jeffrey C. Taylor, Alpine, UT (US)

(73) Assignee: Xactware Solutions, Inc., Lehi, UT (US)

( * ) Notice: Subject to any disclaimer, the term of this patent is extended or adjusted under 35 U.S.C. 154(b) by 615 days.

This patent is subject to a terminal disclaimer.

(21) Appl. No.: 16/545,607

(22) Filed: Aug. 20, 2019

(65) Prior Publication Data

US 2019/0377837 A1   Dec. 12, 2019

Related U.S. Application Data

(63) Continuation of application No. 15/374,695, filed on Dec. 9, 2016, now Pat. No. 10,387,582.

(Continued)

(51) Int. Cl.
| | |
|---|---|
| G06F 30/13 | (2020.01) |
| G06T 7/55 | (2017.01) |
| G06T 7/12 | (2017.01) |

(52) U.S. Cl.
CPC .............. *G06F 30/13* (2020.01); *G06T 7/12* (2017.01); *G06T 7/55* (2017.01); *G06T 2207/10028* (2013.01)

(58) Field of Classification Search
None
See application file for complete search history.

(56) References Cited

U.S. PATENT DOCUMENTS

| | | |
|---|---|---|
| 5,701,403 A | 12/1997 | Watanabe et al. |
| 6,446,030 B1 | 9/2002 | Hoffman et al. |

(Continued)

FOREIGN PATENT DOCUMENTS

| | | |
|---|---|---|
| WO | 2014/151122 A1 | 9/2014 |
| WO | 2016/154306 A1 | 9/2016 |
| WO | 2017/100658 A1 | 6/2017 |

OTHER PUBLICATIONS

Office Action dated Sep. 22, 2020, issued in connection with U.S. Appl. No. 16/580,741 (14 pages).

(Continued)

*Primary Examiner* — Frank S Chen
(74) *Attorney, Agent, or Firm* — McCarter & English, LLP

(57) ABSTRACT

Described in detail herein are systems and methods for generating computerized models of structures using geometry extraction and reconstruction techniques. The system includes a computing device coupled to a input device. The input device obtains raw data scanned by a sensor. The computing device is programmed to execute a data fusion process is applied to fuse the raw data, and a geometry extraction process is performed on the fused data to extract features such as walls, floors, ceilings, roof planes, etc. Large- and small-scale features of the structure are reconstructed using the extracted features. The large- and small-scale features are reconstructed by the system into a floor plan (contour) and/or a polyhedron corresponding to the structure. The system can also process exterior features of the structure to automatically identify condition and areas of roof damage.

33 Claims, 35 Drawing Sheets

Related U.S. Application Data

(60) Provisional application No. 62/265,359, filed on Dec. 9, 2015.

(56) References Cited

U.S. PATENT DOCUMENTS

| | | | |
|---|---|---|---|
| 6,448,964 | B1 | 9/2002 | Isaacs et al. |
| 8,533,063 | B2 | 9/2013 | Erickson |
| 8,843,304 | B1 | 9/2014 | Dupont et al. |
| 8,868,375 | B1 | 10/2014 | Christian |
| 8,983,806 | B2 | 3/2015 | Labrie et al. |
| 9,158,869 | B2 | 10/2015 | Labrie et al. |
| 9,501,700 | B2 | 11/2016 | Loveland et al. |
| 9,679,227 | B2 | 6/2017 | Taylor et al. |
| 10,127,670 | B2 | 11/2018 | Lewis et al. |
| 10,181,079 | B2 | 1/2019 | Labrie et al. |
| 10,289,760 | B1 | 5/2019 | Oakes, III et al. |
| 10,387,582 | B2 | 8/2019 | Lewis et al. |
| 10,445,438 | B1 | 10/2019 | Motonaga et al. |
| 10,529,028 | B1 | 1/2020 | Davis et al. |
| 11,314,905 | B2 | 4/2022 | Childs et al. |
| 2002/0116254 | A1 | 8/2002 | Stein et al. |
| 2003/0009315 | A1 | 1/2003 | Thomas et al. |
| 2007/0080961 | A1 | 4/2007 | Inzinga et al. |
| 2007/0276626 | A1 | 11/2007 | Bruffey |
| 2009/0179895 | A1 | 7/2009 | Zhu et al. |
| 2010/0110074 | A1 | 5/2010 | Pershing |
| 2010/0114537 | A1 | 5/2010 | Pershing |
| 2010/0296693 | A1 | 11/2010 | Thornberry et al. |
| 2011/0056286 | A1 | 3/2011 | Jansen |
| 2011/0157213 | A1 | 6/2011 | Takeyama et al. |
| 2011/0191738 | A1 | 8/2011 | Walker et al. |
| 2012/0026322 | A1 | 2/2012 | Malka et al. |
| 2012/0179431 | A1 | 7/2012 | Labrie et al. |
| 2012/0253725 | A1 | 10/2012 | Malka et al. |
| 2012/0253751 | A1 | 10/2012 | Malka et al. |
| 2013/0201167 | A1 | 8/2013 | Oh et al. |
| 2013/0206177 | A1 | 8/2013 | Burlutskiy |
| 2013/0226451 | A1 | 8/2013 | O'Neill et al. |
| 2013/0262029 | A1 | 10/2013 | Pershing |
| 2013/0267260 | A1 | 10/2013 | Chao et al. |
| 2013/0314688 | A1 | 11/2013 | Likholyot |
| 2014/0043436 | A1* | 2/2014 | Bell .................... H04N 13/246 348/46 |
| 2014/0195275 | A1 | 7/2014 | Pershing et al. |
| 2014/0301633 | A1 | 10/2014 | Furukawa et al. |
| 2014/0320661 | A1 | 10/2014 | Sankar et al. |
| 2015/0029182 | A1 | 1/2015 | Sun et al. |
| 2015/0073864 | A1 | 3/2015 | Labrie et al. |
| 2015/0093047 | A1 | 4/2015 | Battcher et al. |
| 2015/0116509 | A1 | 4/2015 | Bidder et al. |
| 2015/0153172 | A1 | 6/2015 | Starns et al. |
| 2015/0193971 | A1 | 7/2015 | Dryanovski et al. |
| 2015/0213558 | A1 | 7/2015 | Nelson |
| 2015/0227645 | A1 | 8/2015 | Childs et al. |
| 2015/0269438 | A1 | 9/2015 | Samarasekera et al. |
| 2015/0302529 | A1 | 10/2015 | Jagannathan |
| 2016/0098802 | A1 | 4/2016 | Bruffey et al. |
| 2016/0110480 | A1 | 4/2016 | Randolph |
| 2016/0246767 | A1 | 8/2016 | Makadia et al. |
| 2016/0282107 | A1 | 9/2016 | Roland et al. |
| 2017/0124713 | A1 | 5/2017 | Jurgenson et al. |
| 2017/0132711 | A1 | 5/2017 | Bruffey et al. |
| 2017/0132835 | A1 | 5/2017 | Halliday et al. |
| 2017/0169459 | A1 | 6/2017 | Bruffey et al. |
| 2017/0193297 | A1 | 7/2017 | Michini et al. |
| 2017/0206648 | A1 | 7/2017 | Marra et al. |
| 2017/0221152 | A1 | 8/2017 | Nelson et al. |
| 2017/0316115 | A1 | 11/2017 | Lewis et al. |
| 2017/0330207 | A1 | 11/2017 | Labrie et al. |
| 2017/0345069 | A1 | 11/2017 | Labrie et al. |
| 2018/0053329 | A1 | 2/2018 | Roberts et al. |
| 2018/0067593 | A1 | 3/2018 | Tiwari et al. |
| 2018/0089833 | A1 | 3/2018 | Lewis et al. |
| 2018/0286098 | A1 | 10/2018 | Lorenzo |
| 2018/0330528 | A1 | 11/2018 | Loveland et al. |
| 2018/0357819 | A1 | 12/2018 | Oprea |
| 2018/0373931 | A1 | 12/2018 | Li |
| 2019/0114717 | A1 | 4/2019 | Labrie et al. |
| 2019/0147247 | A1 | 5/2019 | Harris et al. |
| 2019/0221040 | A1 | 7/2019 | Shantharam et al. |
| 2019/0340692 | A1 | 11/2019 | Labrie et al. |
| 2020/0100066 | A1 | 3/2020 | Lewis et al. |
| 2020/0143481 | A1 | 5/2020 | Brown et al. |
| 2021/0076162 | A1 | 3/2021 | Wang et al. |
| 2021/0103687 | A1 | 4/2021 | Harris et al. |
| 2021/0350038 | A1 | 11/2021 | Jenson et al. |
| 2022/0309748 | A1 | 9/2022 | Lewis et al. |

OTHER PUBLICATIONS

Office Action dated Feb. 2, 2021, issued in connection with U.S. Appl. No. 14/620,004 (28 pages).

Communication Pursuant to Article 94(3) EPC issued by the European Patent Office dated Feb. 18, 2021, issued in connection with European Patent Application No. 16873975.3 (5 pages).

International Search Report of the International Searching Authority dated Dec. 12, 2019, issued in connection with International Application No. PCT/US2019/52670 (3 pages).

Written Opinion of the International Searching Authority dated Dec. 12, 2019, issued in connection with International Application No. PCT/US2019/52670 (5 pages).

Office Action dated Feb. 5, 2020, issued in connection with U.S. Appl. No. 16/580,741 (15 pages).

International Search Report of the International Searching Authority dated May 14, 2015, issued in connection with International Application No. PCT/US15/015491 (3 pages).

Written Opinion of the International Searching Authority dated May 14, 2015, issued in connection with International Application No. PCT/US15/015491 (9 pages).

Fung, et al., "A Mobile Assisted Localization Scheme for Augmented Reality," Department of Computer Science and Engineering, The Chinese University of Hong Kong, 2012 (76 pages).

Sankar, et al., "Capturing Indoor Scenes With Smartphones," UIST'12, Oct. 7-10, 2012, Cambridge, Massachusetts (9 pages).

Office Action dated Aug. 8, 2017, issued in connection with U.S. Appl. No. 14/620,004 (26 pages).

Office Action dated Aug. 28, 2018, issued in connection with U.S. Appl. No. 14/620,004 (33 pages).

Farin, et al., "Floor-Plan Reconstruction from Panoramic Images," Sep. 23-28, 2007, MM '07, ACM (4 pages).

Office Action dated Mar. 29, 2019, issued in connection with U.S. Appl. No. 14/620,004 (22 pages).

Office Action dated Dec. 10, 2019, issued in connection with U.S. Appl. No. 14/620,004 (27 pages).

Zhang, et al., "Wallk&Sketch: Create Floor Plans with an RGB-D Camera," Sep. 5-8, 2012, UbiComp '12, ACM (10 pages).

Office Action dated Jul. 8, 2020, issued in connection with U.S. Appl. No. 14/620,004 (27 pages).

Examination Report No. 1 dated Mar. 30, 2021, issued by the Australian Patent Office in connection with Australian Patent Application No. 2016366537 (6 pages).

Office Action dated Apr. 21, 2021, issued in connection with U.S. Appl. No. 16/580,741 (15 pages).

Office Action dated Dec. 27, 2021, issued in connection with U.S. Appl. No. 16/580,741 (13 pages).

Notice of Allowance dated Dec. 16, 2021, issued in connection with U.S. Appl. No. 14/620,004 (12 pages).

Invitation to Pay Additional Fees issued by the International Searching Authority dated Feb. 2, 2022, issued in connection with International Application No. PCT/US21/63469 (2 pages).

Extended European Search Report dated Feb. 18, 2022, issued in connection with European Patent Application No. 19866788.3 (9 pages).

Notice of Allowance dated Aug. 19, 2021, issued in connection with U.S. Appl. No. 14/620,004 (11 pages).

Examiner-Initiated Interview Summary dated Aug. 10, 2021, issued in connection with U.S. Appl. No. 14/620,004 (1 page).

(56) References Cited

OTHER PUBLICATIONS

International Search Report of the International Searching Authority dated Feb. 11, 2019, issued in connection with International Application No. PCT/US18/60762 (3 pages).
Written Opinion of the International Searching Authority dated Feb. 11, 2019, issued in connection with International Application No. PCT/US18/60762 (7 pages).
Office Action dated Apr. 16, 2020, issued in connection with U.S. Appl. No. 16/189,512 (10 pages).
U.S. Appl. No. 62/512,989, filed May 31, 2017 entiitled, "Systems and Methods for Rapidly Developing Annotated Computer Models of Structures" (47 pages).
Office Action dated Dec. 14, 2020, issued in connection with U.S. Appl. No. 16/189,512 (10 pages).
Extended European Search Report dated Jul. 1, 2021, issued by the European Patent Office in connection with European Application No. 18876121.7 (8 pages).
Office Action dated Jul. 20, 2021, issued in connection with U.S. Appl. No. 16/189,512 (11 pages).
International Search Report of the International Searching Authority dated Mar. 27, 2017, issued in connection with International Application No. PCT/US2016/65947 (3 pages).
Written Opinion of the International Searching Authority dated Mar. 27, 2017, issued in connection with International Application No. PCT/US2016/65947 (7 pages).
Office Action dated Sep. 26, 2018, issued in connection with U.S. Appl. No. 15/374,695 (33 pages).
Notice of Allowance dated May 13, 2019, issued in connection with U.S. Appl. No. 15/374,695 (7 pages).
Extended European Search Report dated Jun. 11, 2019, issued in connection with European U.S. Appl. No. 16/873,975 (8 pages).
Communication Pursuant to Article 94(3) EPC issued by the European Patent Office dated Apr. 22, 2020, issued n connection with European Patent Application No. 16873975.3 (6 pages).
Dino, et al., "Image-Based Construction of Building Energy Models Using Computer Vision," Automation in Construction (2020) (15 pages).
Fathi, et al., "Automated as-Built 3D Reconstruction of Civil Infrastructure Using Computer Vision: Achievements, Opportunities, and Challenges," Advanced Engineering Informatics (2015) (13 pages).
International Search Report of the International Searching Authority dated Jul. 25, 2022, issued in connection with International Application No. PCT/US22/22024 (3 pages).
Written Opinion of the International Searching Authority dated Jul. 25, 2022, issued in connection with International Application No. PCT/US22/22024 (5 pages).
Office Action dated Sep. 2, 2022, issued in connection with U.S. Appl. No. 16/580,741 (13 pages).
Notice of Allowance dated Sep. 6, 2022, issued in connection with U.S. Appl. No. 16/189,512 (7 pages).
International Search Report of the International Searching Authority dated Apr. 8, 2022, issued in connection with International Application No. PCT/US21/63469 (5 pages).
Written Opinion of the International Searching Authority dated Apr. 8, 2022, issued in connection with International Application No. PCT/US21/63469 (6 pages).
Notice of Allowance dated Apr. 8, 2022, issued in connection with U.S. Appl. No. 16/189,512 (8 pages).
Notice of Allowance dated Jun. 21, 2022, issued in connection with U.S. Appl. No. 16/189,512 (7 pages).
International Search Report of the International Searching Authority dated Nov. 18, 2022, issued in connection with International Application No. PCT/US22/030691 (6 pages).
Written Opinion of the International Searching Authority dated Nov. 18, 2022, issued in connection with International Application No. PCT/US22/030691 (11 pages).
Notice of Allowance dated Dec. 9, 2022, issued in connection with U.S. Appl. No. 17/705,130 (10 pages).
Examination Report No. 1 dated Dec. 15, 2022, issued by the Australian Patent Office in connection with Australian Patent Application No. 2021282413 (3 pages).
Communication Pursuant to Article 94(3) EPC dated Jan. 31, 2023, issued in connection with European Patent Application No. 16873975.3 (8 pages).
Notice of Allowance dated Feb. 14, 2023, issued in connection with U.S. Appl. No. 17/705,130 (5 pages).
Communication Pursuant to Article 94(3) EPC issued by the European Patent Office dated Apr. 28, 2023, issued in connection with European Patent Application No. 19866788.3 (5 pages).
Office Action dated Jun. 30, 2023, issued in connection with U.S. Appl. No. 17/729,613 (49 pages).

* cited by examiner

250

252

254

256

264

SYSTEM AND METHOD FOR GENERATING COMPUTERIZED MODELS OF STRUCTURES USING GEOMETRY EXTRACTION AND RECONSTRUCTION TECHNIQUES

RELATED APPLICATIONS

This application is a continuation of, and claims the benefit of priority to, U.S. patent application Ser. No. 15/374,695 filed on Dec. 9, 2016, now U.S. Pat. No. 10,387,582, issued on Aug. 20, 2019, which claims priority to U.S. Provisional Application No. 62/265,359 filed on Dec. 9, 2015, the contents of the application is hereby incorporated by reference in its entirety.

BACKGROUND OF INVENTION

Field of the Disclosure

The present disclosure relates generally to a system and method for generating computerized models of structures using computing devices. More specifically, the present disclosure relates to a system and method for generating computerized models of structures using geometry extraction and reconstruction techniques.

Related Art

In the insurance underwriting, building construction, solar, and real estate industries, computer-based systems for generating models of physical structures such as residential homes, commercial buildings, etc., is becoming increasingly important. In particular, in order to create an accurate model of a physical structure, one must have an accurate set of data which adequately describes that structure. Moreover, it is becoming increasingly important to provide computer-based systems which have adequate capabilities to generate three-dimensional (3D) models of both the interior and exterior features of buildings, as well as to identify specific features of such buildings (e.g., interior wall/floor/ceiling features, etc.) and condition (exterior wall damage, roof damage, etc.).

With the advent of mobile data capturing devices including phones, tablets and unmanned aerial and ground based vehicles, it is now possible to gather and process accurate data from sites located anywhere in the world. The data can be processed either directly on a hand-held computing device or some other type of device, such as an unmanned aerial vehicle (UAV) or system (UAS) (provided that such devices have adequate computing power), or remotely on a data processing server.

Accordingly, what would be desirable is a system and method for generating three-dimensional models of structures using geometry extraction (such as feature growing) and feature reconstruction techniques.

SUMMARY OF THE INVENTION

The present invention relates to a system and method for generating computerized models of structures (such as interior and exterior features of buildings, homes, dwellings, etc., including interior and exterior features of such structures) using geometry extraction and reconstruction techniques. The system includes a structure modeling engine executed by a computing device, such as a mobile smart phone. The system obtains raw data scanned by a sensor in communication with the smart phone, such as a series of photos, RGB image data (still, fisheye, panoramic, video, etc.), infrared (IR) image data, mobile sensor data (gyroscope/accelerometer/barometer, etc.), laser range data (point cloud data), LIDAR, global positioning system (GPS) data, X-ray data, magnetic field data, depth maps, and other types of data. A data fusion process is applied to fuse the raw data, and a geometry extraction process is performed on the fused data to extract features such as walls, floors, ceilings, roof planes, etc. Large-scale features of the structure are then reconstructed by the system using the extracted features. Optionally, small-scale features of the structure could also be reconstructed by the system. The large- and small-scale features are reconstructed by the system into a floor plan (contour) and/or a polyhedron corresponding to the structure. Optionally, the system can also process exterior features such as roof and wall image data to automatically identify condition and areas of roof damage.

BRIEF DESCRIPTION OF THE DRAWINGS

The foregoing features of the invention will be apparent from the following Detailed Description, taken in connection with the accompanying drawings, in which.

DETAILED DESCRIPTION

The present disclosure relates to a system and method for generating three-dimensional computer models of structures using geometry extraction and reconstruction techniques, as described in detail below in connection with FIGS. 1-14H. As used herein, the term "structure" refers to physical structures such as homes, dwellings, buildings, etc.

Figure 1:
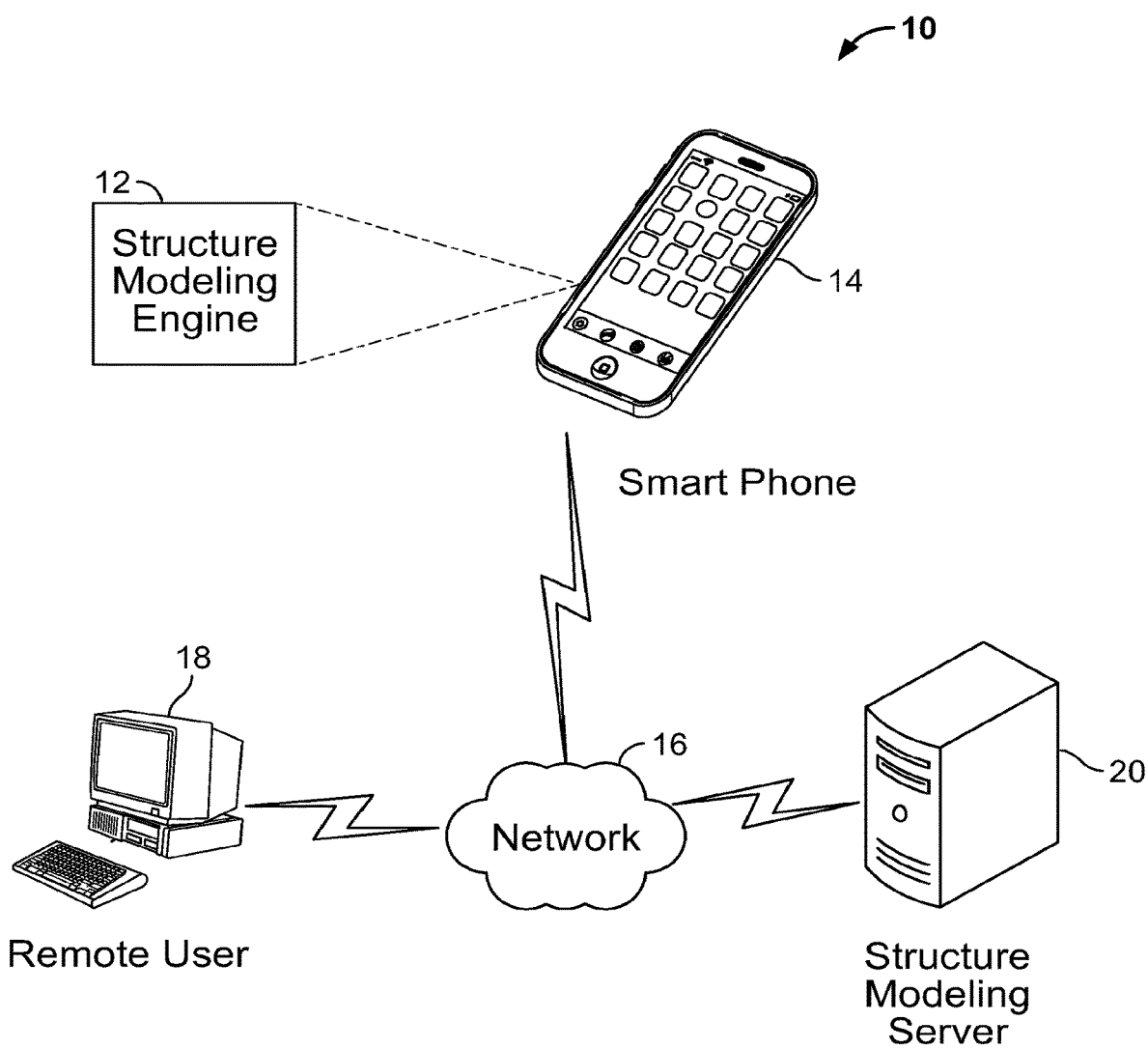
FIG. 1 is a diagram illustrating hardware and software components of the system of the present disclosure.

FIG. 1 is a diagram, indicated generally at 10, illustrating hardware and software components of the system of the present disclosure. The system includes a structure modeling engine 12 which is embodied as specially-programmed software code that executes on a suitable computing device, such as a smart phone 14. As will be discussed in greater detail below, the modeling engine 12 allows a user of the smart phone 14 to quickly and conveniently generate three-dimensional computer models of structures. It is noted that the smart phone 14 could be substitute for another type of computing device, such as a tablet computer, a laptop computer, a personal (standalone) computer, etc., without departing from the spirit or scope of the present disclosure. In the case of a smart phone, the smart phone 14 could execute any suitable operating system. The modeling engine 12 is stored in non-volatile memory of the smart phone 14, and is executed by a processor of the smart phone 14. As will be discussed in greater detail below, the modeling engine processes raw data obtained by one or more sensors associated with the phone 14, such as the phone's camera and/or other sensors such as a light detection and ranging (LIDAR) camera, etc. It is also noted that the engine 12 could be programmed into and executed by an unmanned aerial vehicle (UAV) and/or system (UAS), if desired, such that the UAV/UAS is capable of flying around a structure, taking digital imagery or LIDAR data using on-board sensors, and processing the data in accordance with the present disclosure to generate three-dimensional models of the structure.

The smart phone 14 can communicate via a network 16 with a remote user's computer system 18, and/or with a remote structure modeling server 20. The remote structure modeling server 20 could also be programmed with and execute the structure modeling engine 12, if desired. Such an arrangement is particularly advantageous where the smart phone 14 does not have sufficient processing power to rapidly generate three-dimensional models of structures, in which case the server 20 can remotely perform such functions. In such circumstances, the remote server 20 would receive raw captured data from the smart phone 14 via the network 16. The network 16 could include the Internet, a cellular data network, a wireless network, a wired network, etc. Of course, the server 20 could be a stand-alone server, or it could be part of a "cloud" computing environment/platform, if desired.

Figure 2:
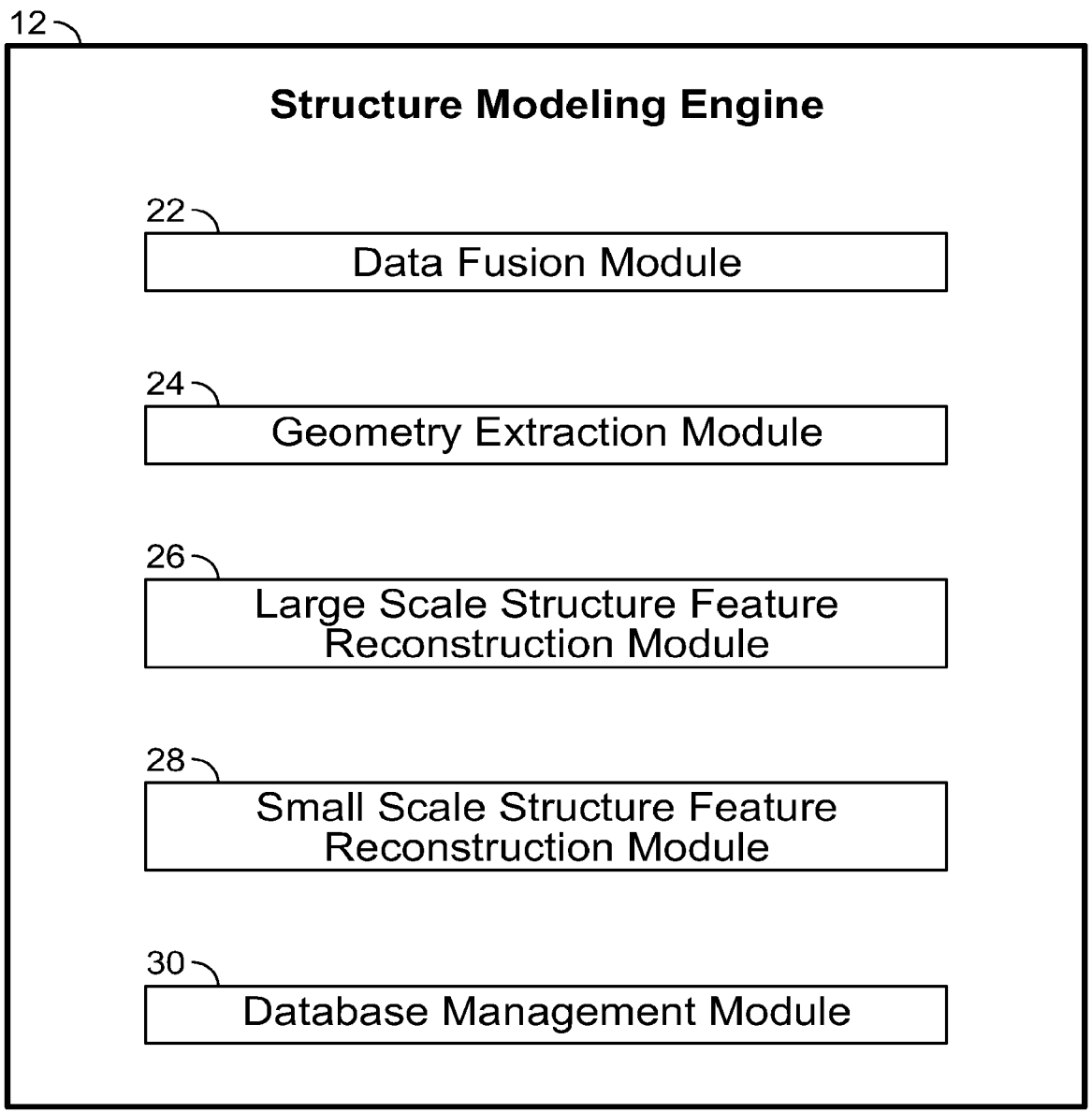
FIG. 2 is a diagram illustrating software components of the system in greater detail.

FIG. 2 is a diagram illustrating the structure modeling engine 12 in greater detail. The structure modeling engine 12 includes a plurality of software modules 22-30 which perform various functions in accordance with the present disclosure. For example, the engine 12 includes a data fusion module 22, a geometry extraction module 24, a large-scale structure feature reconstruction module 26, a small-scale structure feature reconstruction module 28, and a database management module 30. The functions of each of these modules are discussed in greater detail below. It is noted that the modules 22-30 and the engine 12 could be programmed using any suitable high- or low-level programming language, such as Java, C, C#, C++, Python, etc., without departing from the spirit or scope of the present disclosure.

Figure 3:
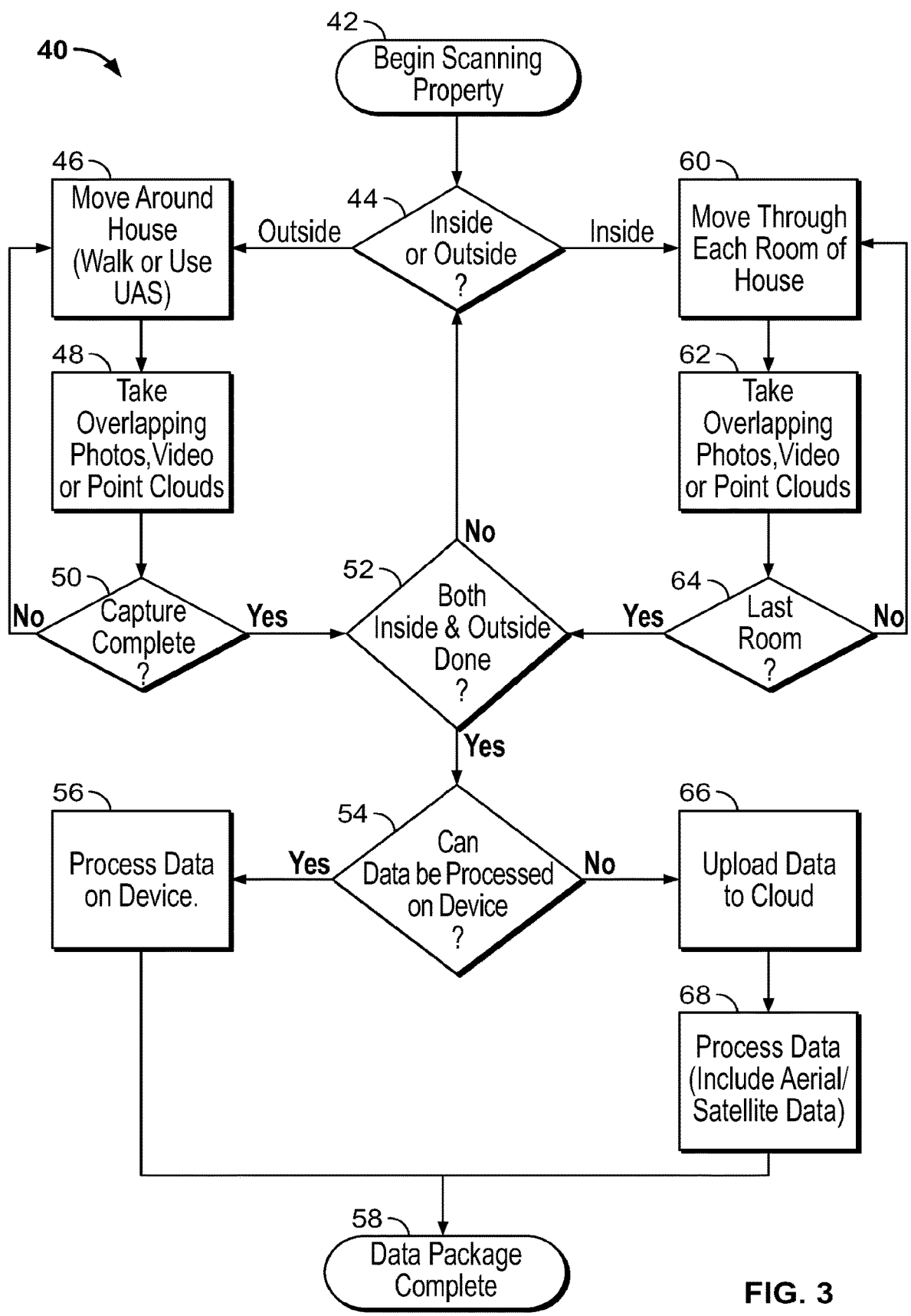
FIGS. 3-4 are flowcharts illustrating high-level processing steps carried out by the system for generating a three-dimensional computer model of a physical structure.

FIG. 3 is a flowchart illustrating high-level processing steps carried out by the system, and indicated generally at 40. Beginning in step 42, the user begins scanning a structure using one or more sensors of the smart phone 14. Then, in step 44, the system determines whether the user is inside or outside. It is noted that step 44 could be carried out by a user of the system, i.e., the user can specify (e.g., using one or more user interface controls displayed by the system) whether the user is located inside or outside of a structure. If the user is outside, step 46 occurs, wherein the smart phone 14 is moved around the structure (e.g., by the user walking around the structure and pointing the smart phone 14 at the structure, or, in the case of a UAV or UAS, by flying the UAV/UAS around the structure). In step 48, the system takes overlapping photos, videos, and/or LIDAR point clouds of the structure. In step 50, a determination is made as to whether sufficient coverage of the structure has been provided. This could be accomplished by tracking that data has been captured in a 360 degree circle, or by processing a user input, such that the user signals to the system that he or she has captured what is believed to be enough coverage. If a negative determination is made, control returns to step 46. Otherwise, step 52 occurs, wherein a determination is made as to whether capturing of inside and/or outside images is complete. If a negative determination is made, control returns to step 44. Otherwise, step 54 occurs, wherein a determination is made as to whether the captured data can be processed on the device (e.g., using the processor of the smart phone 14, the processor of the UAV/UAS, the processor of the laptop/tablet computer, etc.). If a positive determination is made, step 56 occurs, wherein the data is processed on the device. Otherwise, step 66 occurs, wherein the data is uploaded to a cloud platform (e.g., to a cloud service provider, to the server 20 of FIG. 1, etc.). Then, in step 68, the data is processed on the cloud platform (e.g., on the server 20), including aerial data, satellite data, obtained imagery, etc. In step 58, the data package is complete.

In the event that a determination is made in step 44 that scanning of the inside of a structure is to be done, step 60 occurs wherein the user moves through each room of the structure using the smart phone 14. Then, in step 62, as the user moves through a room, the user takes overlapping photos, videos, and/or LIDAR point clouds using the phone 14 and/or sensor associated with the phone 14. Then, in step 64, a determination is made as to whether the last room has been captured. If a positive determination is made, step 52 occurs; otherwise, control returns to step 60.

Figure 4:
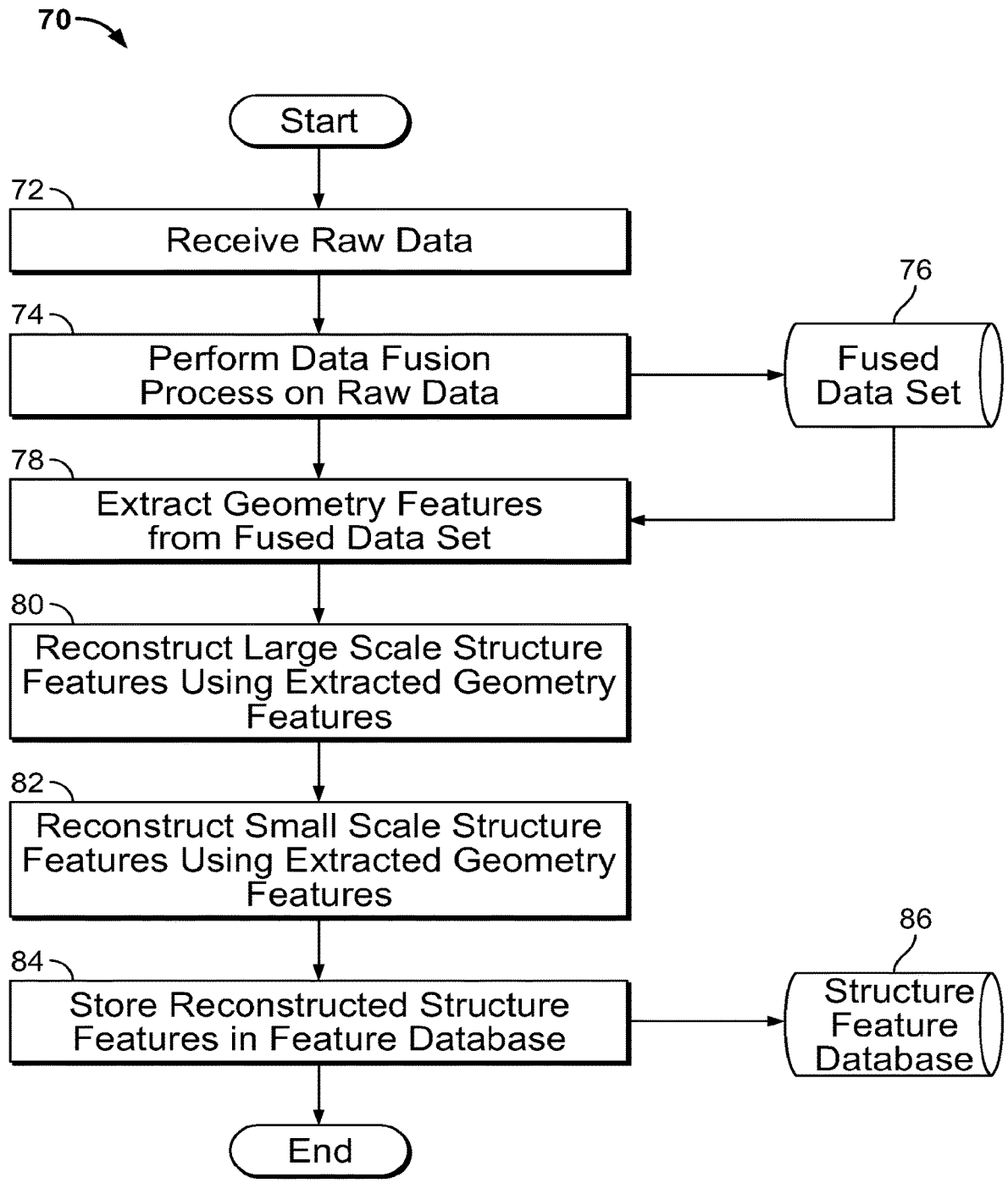

FIG. 4 is a further flowchart illustrating high-level processing steps carried out by the system, indicated generally at 70. Beginning in step 72, the engine 12 receives raw data from one or more sensors associated with the phone 14 (or, in the case of a UAS/UAV, from on-board sensors of such devices). Such data can be obtained from many devices with the appropriate sensors and the capability of storing, processing and/or transmitting the data. Examples of such devices includes, but is not limited to, image capturing devices such as digital cameras and video cameras, smart phones, tablet computers, laptop computers, wearable computers, laser scanners, scanning range finders, RGB-D sensors, mobile sensors such as those mounted on robots or UAVs, and/or other types of sensors. Also, the system can process many types of data which can be utilized to generate models of structures. Examples of such data include, but is not limited to, RGB image data (still, fisheye, panoramic, video, etc.), infrared (IR) image data, mobile sensor data (gyroscope/accelerometer/barometer, etc.), laser range data (point cloud data), LIDAR, global positioning system (GPS) data, X-ray data, magnetic field data, depth maps, and other types of data.

In step 74, a data fusion process is performed on the raw data. In order to utilize the raw data, it must be collated/fused into a coherent data set. For example, if the structure data is captured a frame at a time, the data from one frame is not sufficient to reconstruct the entire structure. The data from each frame must be merged, aligned and made to be consistent with the rest of the frame data from the entire structure. This process is called frame registration and may use position and orientation to calculate the sensor's position for each frame. In addition, data from multiple sources must be synchronized. For example, the color image data must be synchronized with the fisheye, IR, range, gyro/accelerometer and GPS data. The end result is a coherent data set from which meaningful information about the structure can be extracted. The processed data is stored in a fused data set database 76.

In step 78, the fused data is processed by the system to extract geometry features therefrom. Data extraction depends on the ability to identify specific geometric elements in the data set. Specific algorithms with optimal pipeline and parameters could be utilized depending on the nature of input and estimated input accuracy, and could include the following steps:

1. Data filtering: removing noise, sensor distortions, inaccuracies and elements that are not required during the capture process (e.g., wall paintings, keys in a table, etc.)
2. Calculate geometries from source data. The geometries could be calculated iteratively as follows:
   a. Find the most evident raw geometry: lines, planes, intersections, etc. Otherwise, this step is completed.
   b. Remove data that describes this geometry from input data.
   c. Go back to point a.
3. Reconsider captured geometries iteratively:
   a. Square up geometries: aligning them to Cartesian axis XYZ as possible.
   b. Join or discard elements that are geometrically impossible. Remove degenerated geometries, merge parallel lines and planes.
   c. Find obstructed details from intersections and coalescence of different planes and lines. Such as wall corners behind a lamp, glass windows/doors not detected by the sensor or window/doors openings.

The geometries could be classified as real elements by assigning them a meaning, discarding, adapting or merging geometries from step 3 above, e.g., extract structure façade and rooms using concave and convex hull algorithms, identify geometries as real objects using neural networks and then, refine polyhedral geometry, etc. In addition, geometry extraction can be performed using publicly-available software algorithm libraries such as Point Cloud Library (PCL), Eigen Math Library, Open Computer Vision library (OpenCV), and others. Examples of features which can be extracted in step 76 include, but are not limited to, edges, lines, planes, points, corners (where lines and/or planes intersect), and other features.

In step 80, the system reconstructs large-scale structure features, such as walls, ceilings, floors, etc., from the extracted geometry features. This process is described in greater detail below in connection with FIG. 5. Then, in step 82, the system reconstructs small-scale structure features (such as room types, materials, wall features, fixtures, etc.) from the extracted geometry features. In step 84, the system stores the reconstructed structure features in a feature database 86, for subsequent retrieval and usage. The system also displays the extracted features to the user via a user interface generated by the phone 14 and/or the remote user computer system 18.

Figure 5:
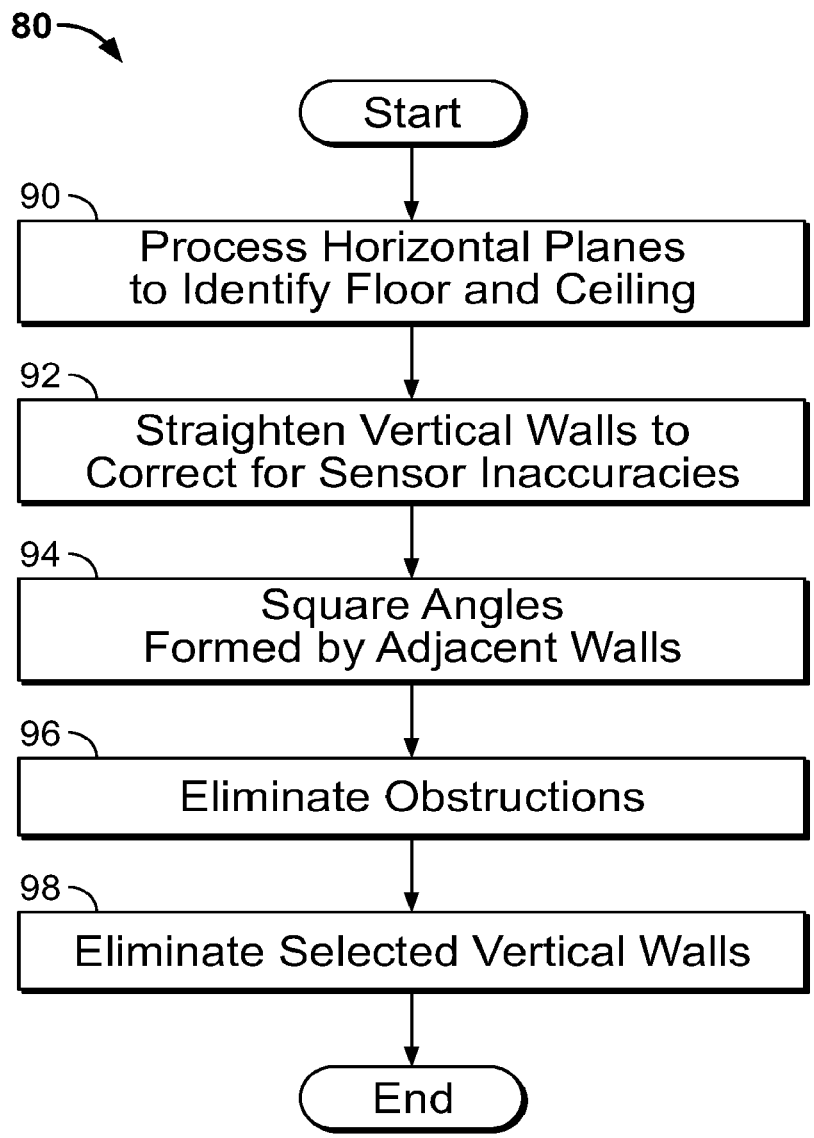
FIG. 5 is a flowchart illustrating processing steps carried out by the system for reconstructing large scale features.
Figure 6:
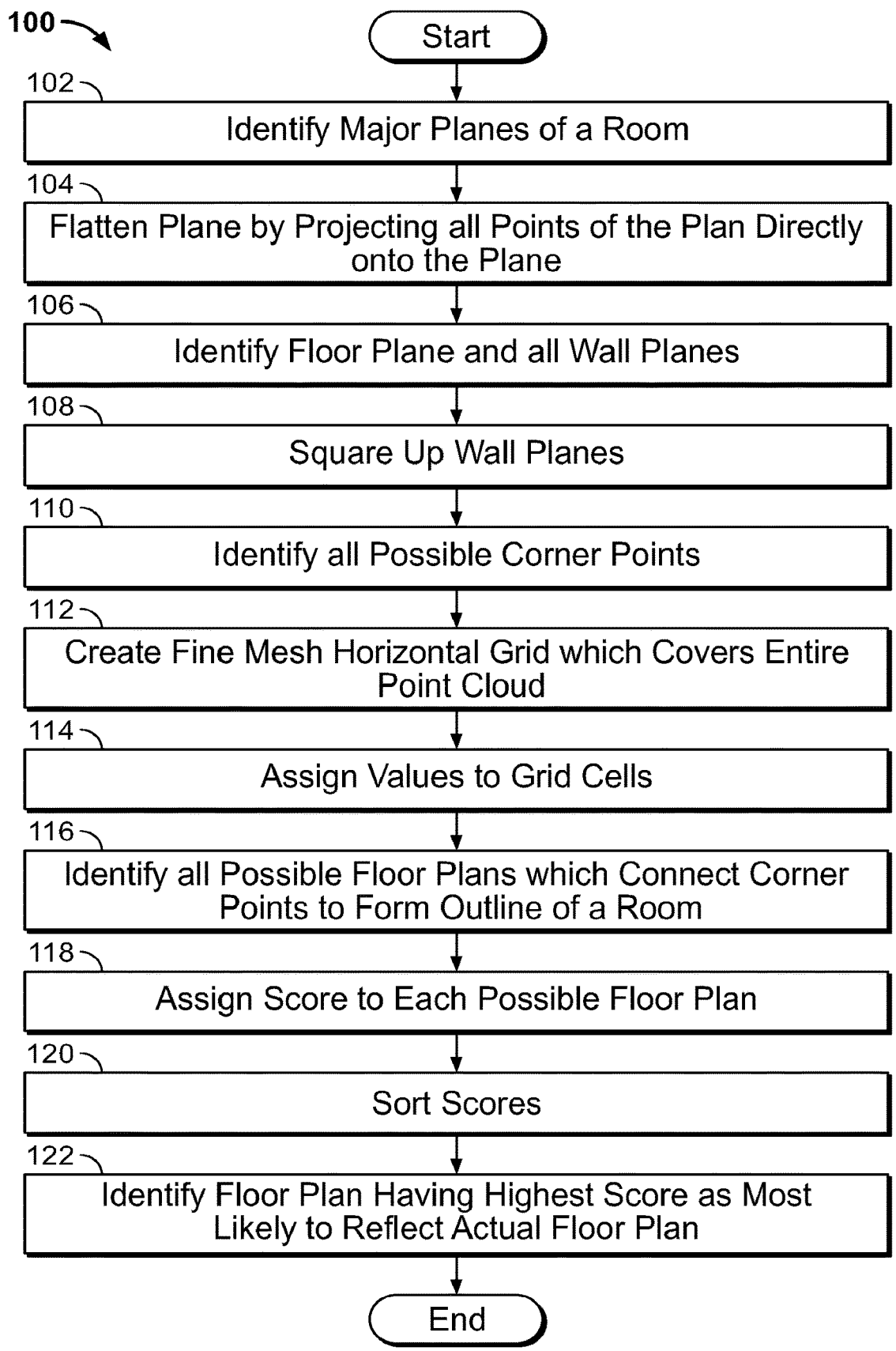
FIG. 6 is a flowchart illustrating processing steps carried out by the system for generating a computerized floor plan of a physical structure.
Figure 7A:
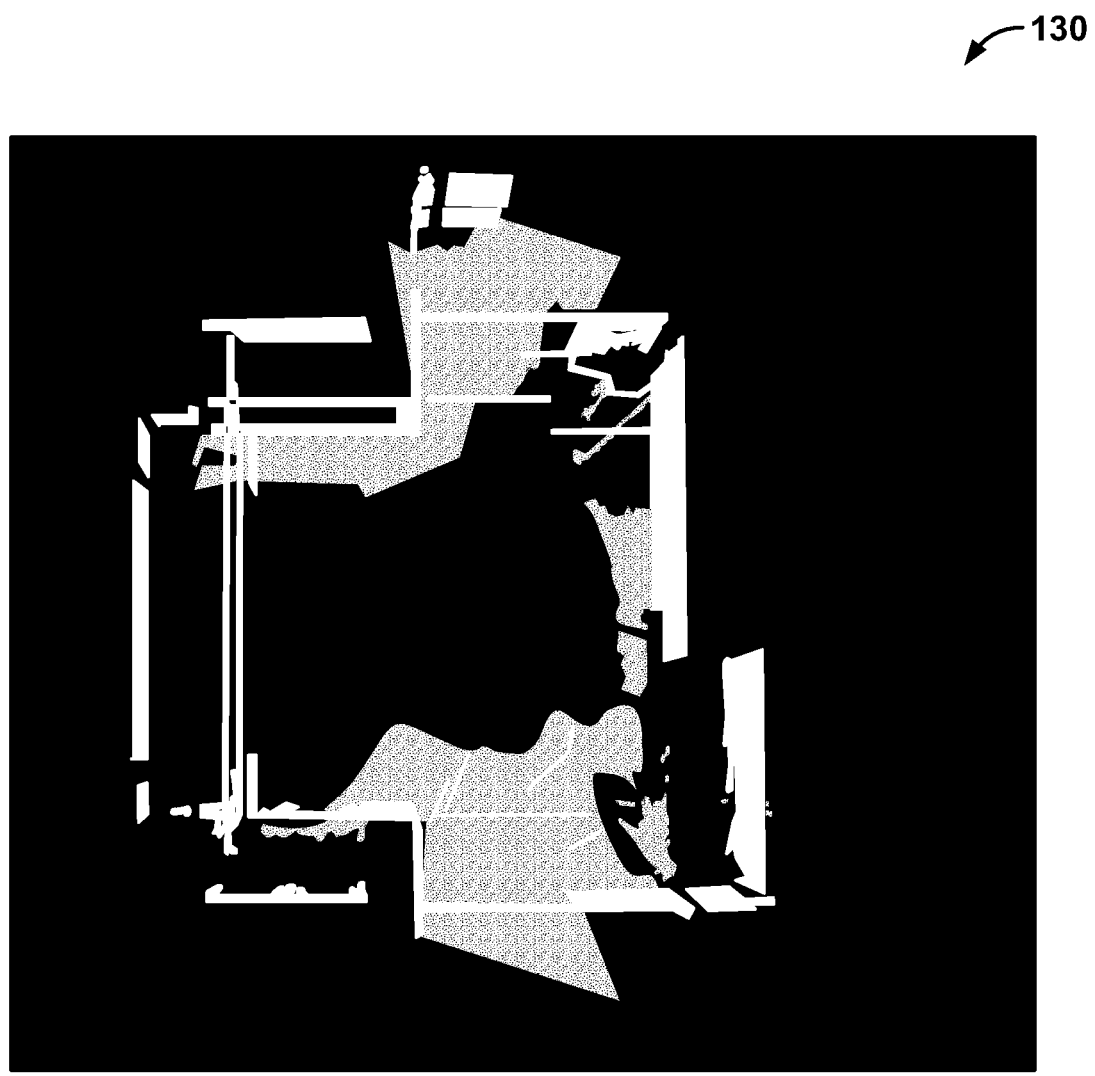
FIGS. 7A-7C are images illustrating the processing steps of FIG. 6.
Figure 7B:
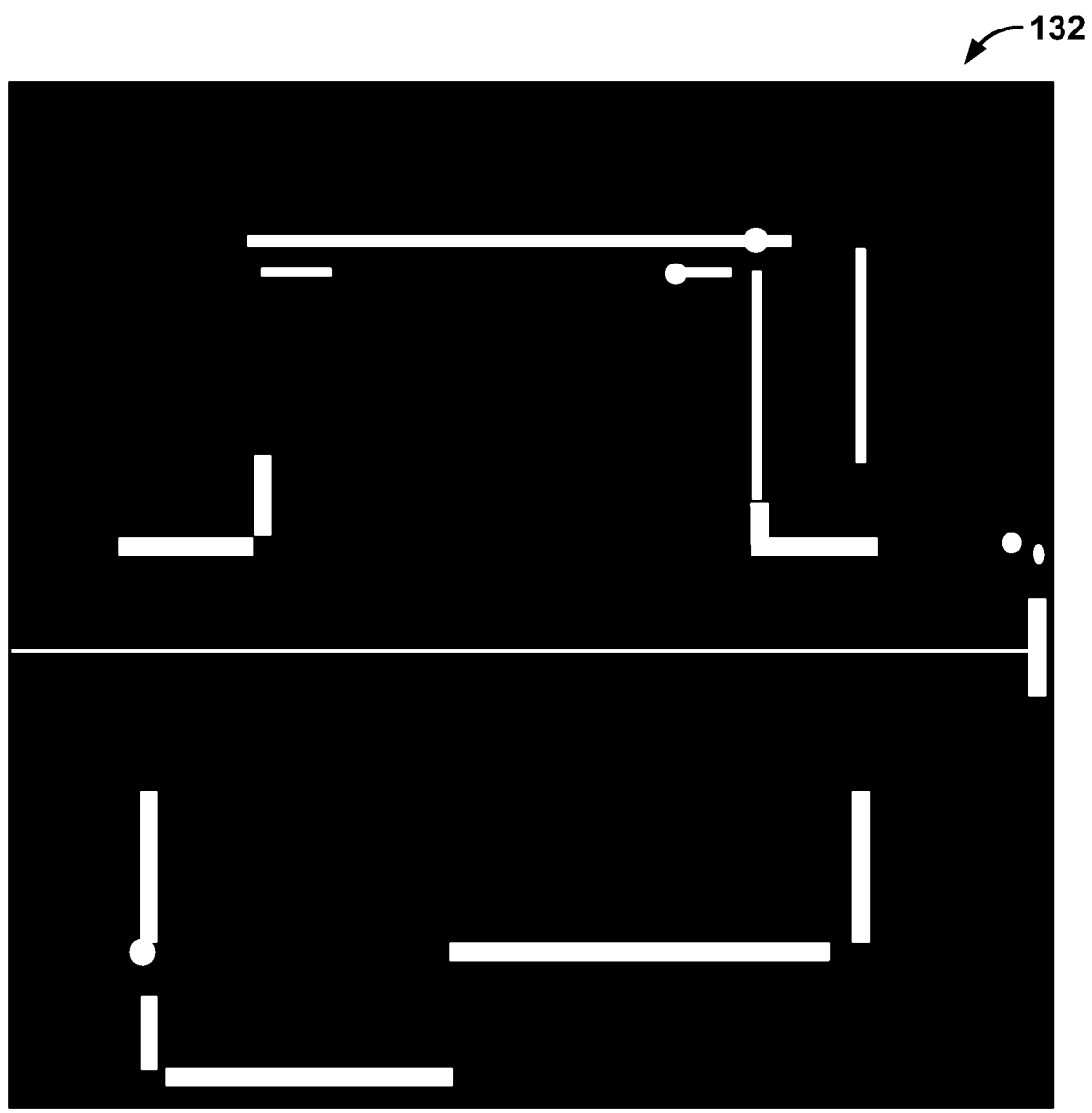
Figure 7C:
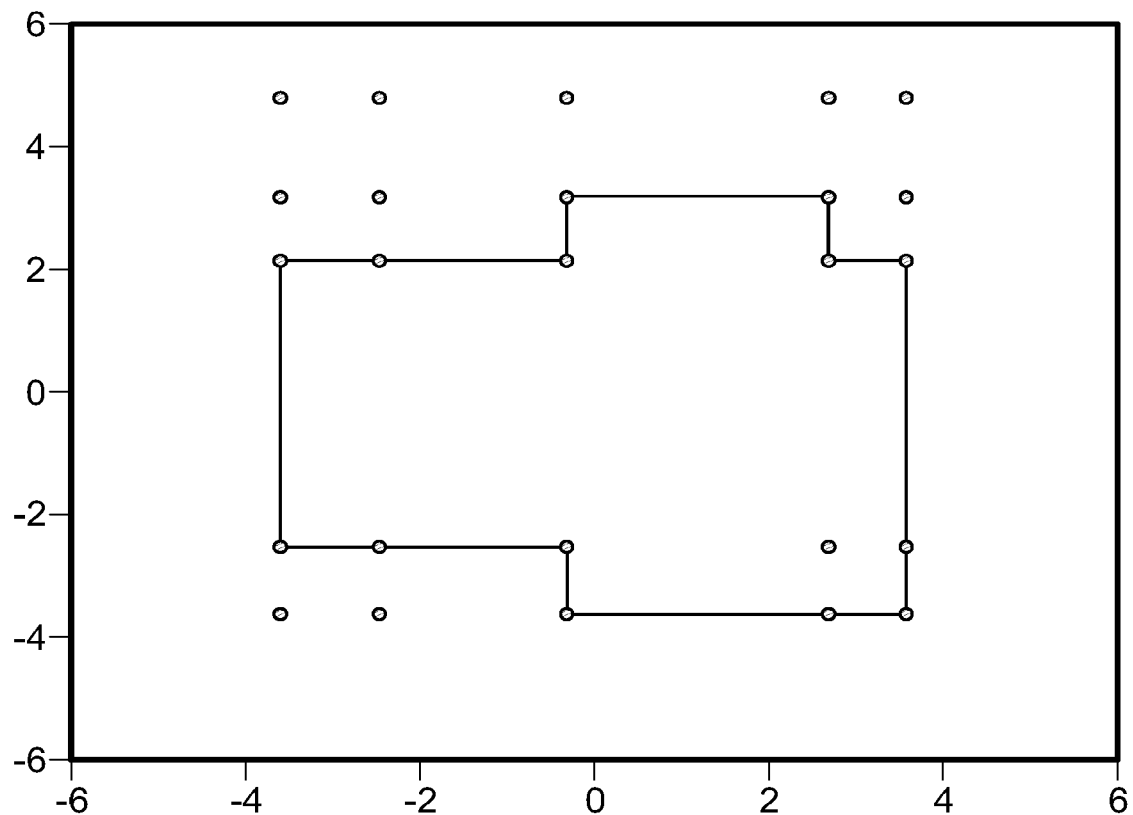
Figure 8:
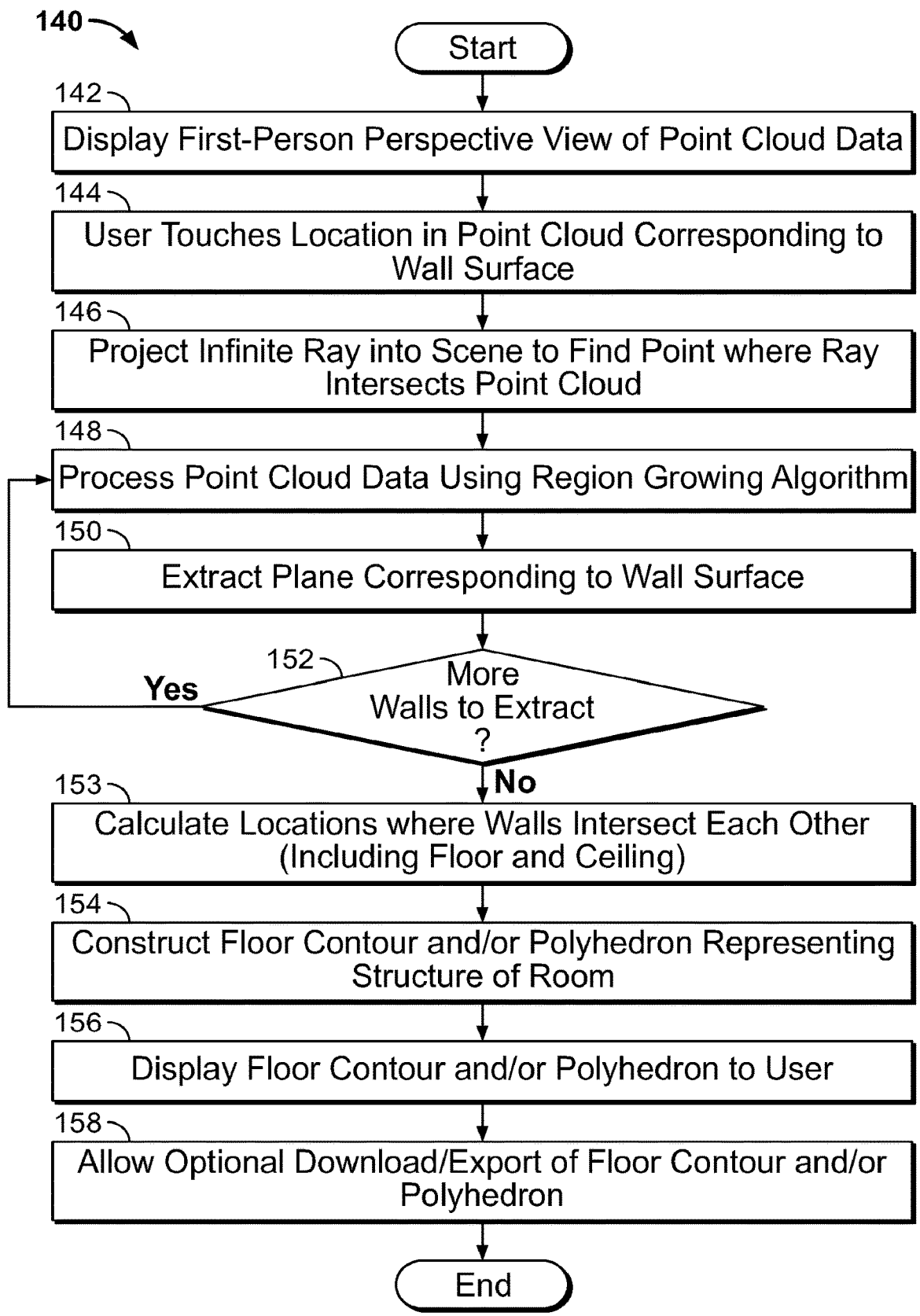
FIG. 8 is a flowchart illustrating processing steps carried out by the system for generating a computerized floor contour and/or polyhedron corresponding to a physical structure.

FIG. 5 is a flowchart illustrating process step 80 of FIG. 4 in greater detail. As mentioned above, in step 80, the system reconstructs large-scale structure features from the extracted geometry. Once the basic geometric elements have been identified, they can be used to create a 3D model of the structure. This involves identifying the wall, floor, ceiling planes and roof planes and then determining the relationship between them. In step 90, the system processes planes to determine which planes correspond to the floor and ceiling of the structure. It is noted that this step need not be carried out with planes. Further, this step can be accomplished by using a PCL library to identify the major planes of the room, by snapping all points in plane to the "best fit" plane equation (e.g., correct inaccuracies), and by identifying planes that are parallel to the plane Y=0 as the floor and ceiling planes. Next, in step 92, the system straightens vertical walls to correct for sensor inaccuracies. This can be accomplished by using a PCL library to identify the major planes of the room, by finding the best fit plane equation for each plane, and by snapping each point in the plane to the new plane equation.

In step 94, the system squares angles formed by adjacent walls. This can be accomplished by using a PCL library to identify the major planes of the room, finding plane centroids, finding an angle between two plane normals vectors in the X-Z plane, adjusting the normal vectors to be an increment of 22.5 degrees, re-computing plane equations (dot product of new normal and centroid), and eliminating obstructions such as cabinets and furniture.

In step 96, the system eliminates vertical walls which do not contribute to the room structure, such as walls from other rooms seen through doorways. This can be accomplished by using a PCL library to identify the major planes of the room, identifying possible candidates (two planes that are parallel and exist in the same quadrant when the camera is positioned at the origin), finding the two planes' bounding boxes, and creating a pyramid for each plane. The top point of the pyramid is identified as the camera location, and the base is the plane's bounding box. Additionally, the system could identify closer and farther planes, and could automatically remove the farther plane if its pyramid is completely contained inside the closer plane's pyramid. The pyramid discussed herein can be seen and described in greater detail below in connection with FIGS. 9B-9C.

Referring to both FIGS. 6 and 7A-7C, FIG. 6 is a flowchart illustrating processing steps in accordance with the present disclosure, indicated generally at 100, for automatically identifying a floor plan for a room from point cloud data. Beginning in step 102, the system processes the point cloud data to identify major planes of a room. This can be accomplished by using a PCL library to identify the major planes of the room. Then, in step 104, the system flattens the plane by projecting all points of the plane directly onto the plane. In step 106, the system identifies the floor plane and all wall (vertical) planes. In step 108, the system adjusts all wall planes to be perfectly vertical. This can be accomplished by projecting all points to be on the common plane In step 110, the system identifies all possible corner points where 2 wall planes and the floor plane meet. This step is illustrated by the image 130 in FIG. 7A, which shows a point cloud with all possible corner points identified. Then, in step 112, the system creates a fine mesh horizontal grid which covers the entire point cloud. In step 114, the system assigns values to the grid cells. As illustrated in the image 132 in FIG. 7B, the values correspond with the number of points from the cloud which project onto that cell in the horizontal grid (e.g., flattening the point cloud). In step 116, the system identifies all possible floor plans which connect corner points to form an outline of a room. This step is illustrated in the image 134 in FIG. 7C, and can be accomplished using a recursive depth first search technique.

In step 118, the system assigns a score to each possible floor plan. The score reflects how well the edges of the floor plan line up with high value cells in the grid. Then, in step 120, the system sorts the scores. In step 122, the system identifies the floor plan having the highest score as the most likely to reflect the actual floor plan of the room.

The processing steps 100 illustrated in FIGS. 6 and 7A-7C could be carried out as follows: First, the user captures the entire room in a 3D point cloud, using a suitable sensor (e.g., a LIDAR scanner connected to a portable computer or to the smart phone 14). While viewing the captured cloud on the device, the user identifies where the major walls are located by tapping the screen at the respective locations. The position of the tap location on the cloud is then used by the system to calculate a 3D position which is stored as a user selected point. Then, the system uses a region growing algorithm in connection with the user selected points to extract major planes from the point cloud. The system correlates user-supplied "assist" points with the extracted planes to determine which are the wall planes. Then, the system intersects planes that are identified as wall planes to create intersection lines. Finally, the system intersects each intersection line with the floor plane to create floor plan. Additionally, it is noted that the processing steps illustrated in FIGS. 6 and 7A-7C can be carried out while the user is capturing data, by clicking on the screen to identify planes or after the fact, and/or by viewing a point cloud and clicking on "important" items.

Figure 9A:
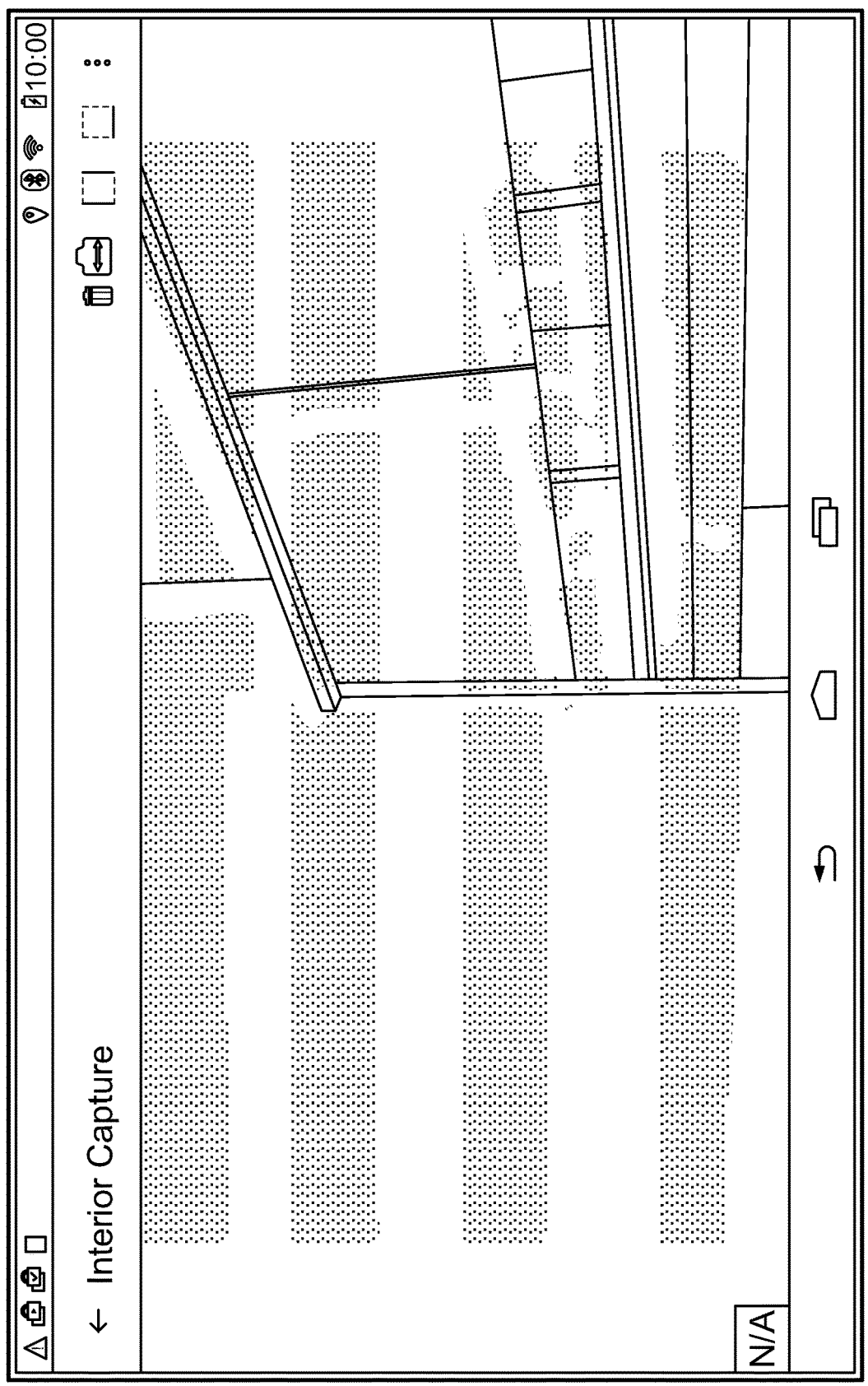
FIGS. 9A-9F are screenshots illustrating the processing steps of FIG. 8 carried out by the system.
Figure 9B:
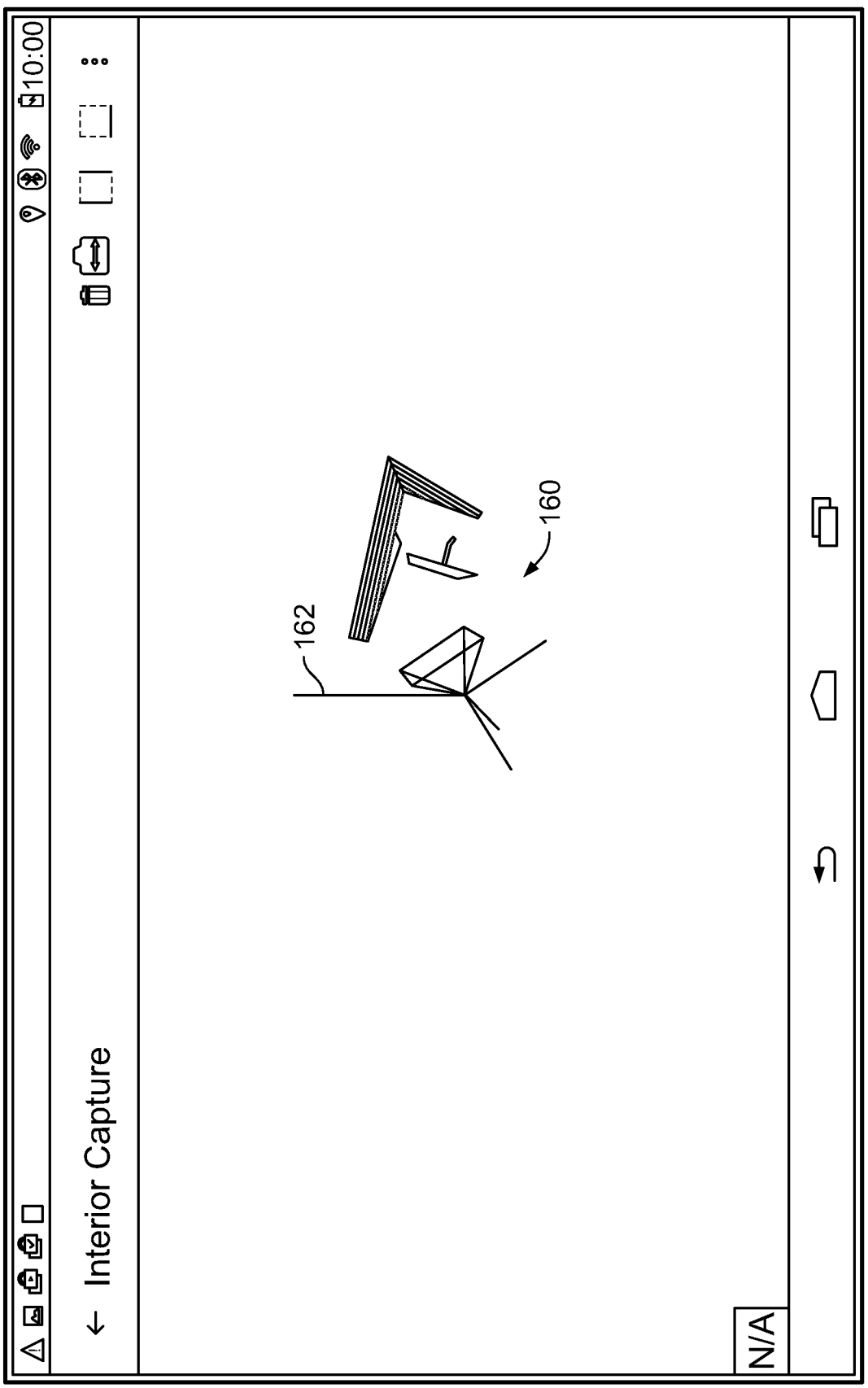

Referring to FIGS. 8 and 9A-9F, FIG. 8 is a flowchart illustrating processing steps, indicated generally at 140, carried out by the system for automatically generating floor contours and/or polyhedrons representing a structure. Beginning in step 142, the system begins by displaying to the user (e.g., on a display of the smart phone 14) a first-person perspective view of the point cloud data produced by the device. This is illustrated in FIG. 9A, which shows the perspective view of the point cloud 160. Then, in step 144, the user touches a location on the screen in the point cloud that is a representative location in the world for where the wall surface is located. This is illustrated in FIG. 9B. Then, in step 146, the system projects an infinite ray into the scene to find the point where the ray intersects the point cloud. The infinite ray 162 is shown in FIG. 9B, and projects through the point cloud 160. It is noted that the triangle shown in FIG. 9B corresponds to the smart phone camera and illustrates its location within the scene, such that the apex (tip) of the triangle corresponds to the camera location.

In step 148, the point of intersection between the ray 162 and the point cloud 160 is used by the system as a seed for a region growing plane extraction algorithm, such that the system processes the point cloud data using such an algorithm. The region growing algorithm can be described in two stages. The first stage initializes the region to extract and finds an arbitrary number of new region candidates. The region is initialized with the seed from the point cloud and its nearest neighbor in the point cloud 160. At this stage, the region is two points, and from this information, the system calculates the center and normal for an optimal plane of the region. Then, a set of candidates to be added to the region is initialized. The nearest neighbors to the seed of the region are tested to determine if they are close enough to be good region candidates. The second stage grows the region incrementally by evaluating each region candidate. In order for a region candidate to be added to the region, it must meet the following criteria: (1) the region candidate is within a distance threshold of the region; (2) if the region candidate is added to the region, the new mean squared error of the region must be less than a mean squared error threshold; and (3) if the region candidate is added to the region, it must be within a distance threshold to the new optimal plane calculated for the region. Many of these checks are computationally-intense if there are thousands of points being evaluated. Therefore, in order to optimize this portion so that it can run on mobile devices, the mean squared error and principle component analysis are calculated incrementally as candidates are added to a region. If a region candidate meets the above criteria, then it is added to the region. The candidate added to the region is then used to update the list of region candidates. In this way the region can continue to grow beyond the immediate neighbors of the seed.

Figure 9C:
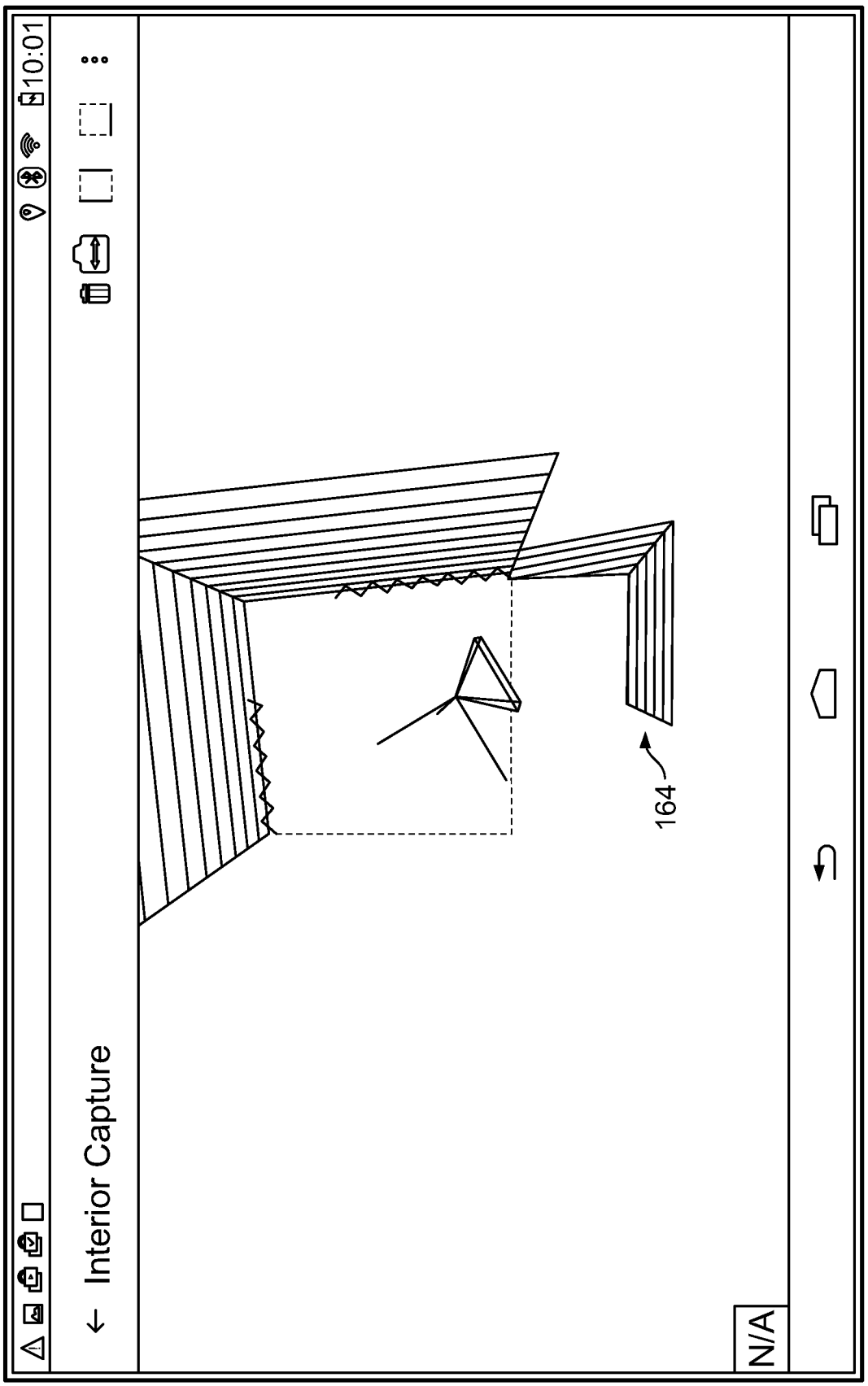
Figure 9D:
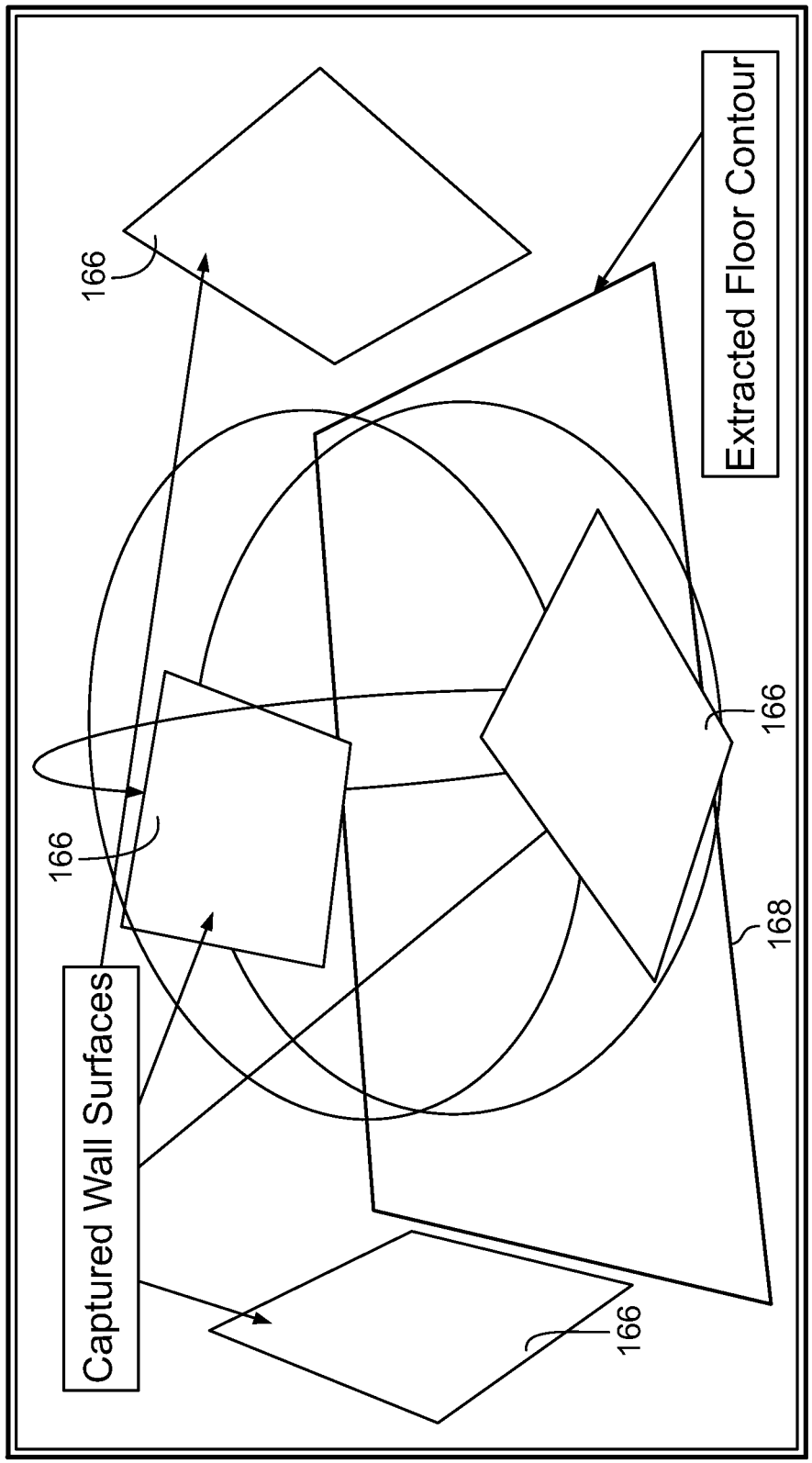

The region continues growing until there are no more candidates or it has reached a maximum region size. If a grown region does not meet a minimum threshold for region size it is not considered a valid planar region. Thus, as is shown in step 152, a determination is made as to whether there are more walls (planes) to extract. This is illustrated in FIG. 9C, wherein an additional point cloud 164 is processed in the manner described herein to extract walls. If a positive determination is made, control returns to step 148. Otherwise, step 152 occurs, wherein the system attempts to build a coherent structure from the captured planes. This is done by calculating where the walls intersect each other as well as where each wall intersects the floor and ceiling. If the entire structure is captured, this will give finite segments that form the geometry of the room. In step 154, the system constructs a floor contour and/or polyhedron representing the structure of the room. This is illustrated in FIG. 9D, wherein the extracted walls 166 and floor plane (or, contour) 168 is "assembled" by the system to create a polyhedron representing the interior structure of a room.

Figure 9E:
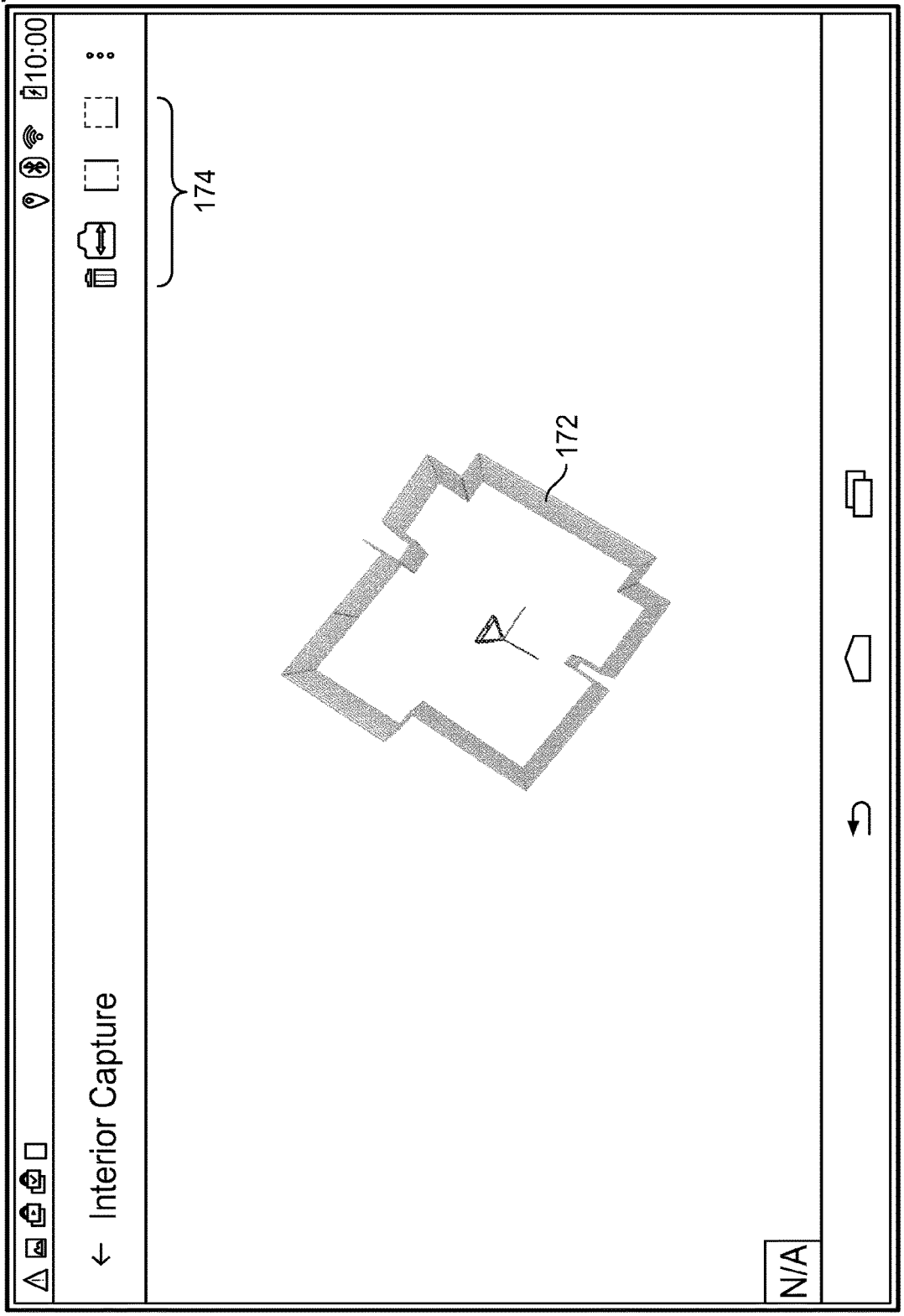
Figure 9F:
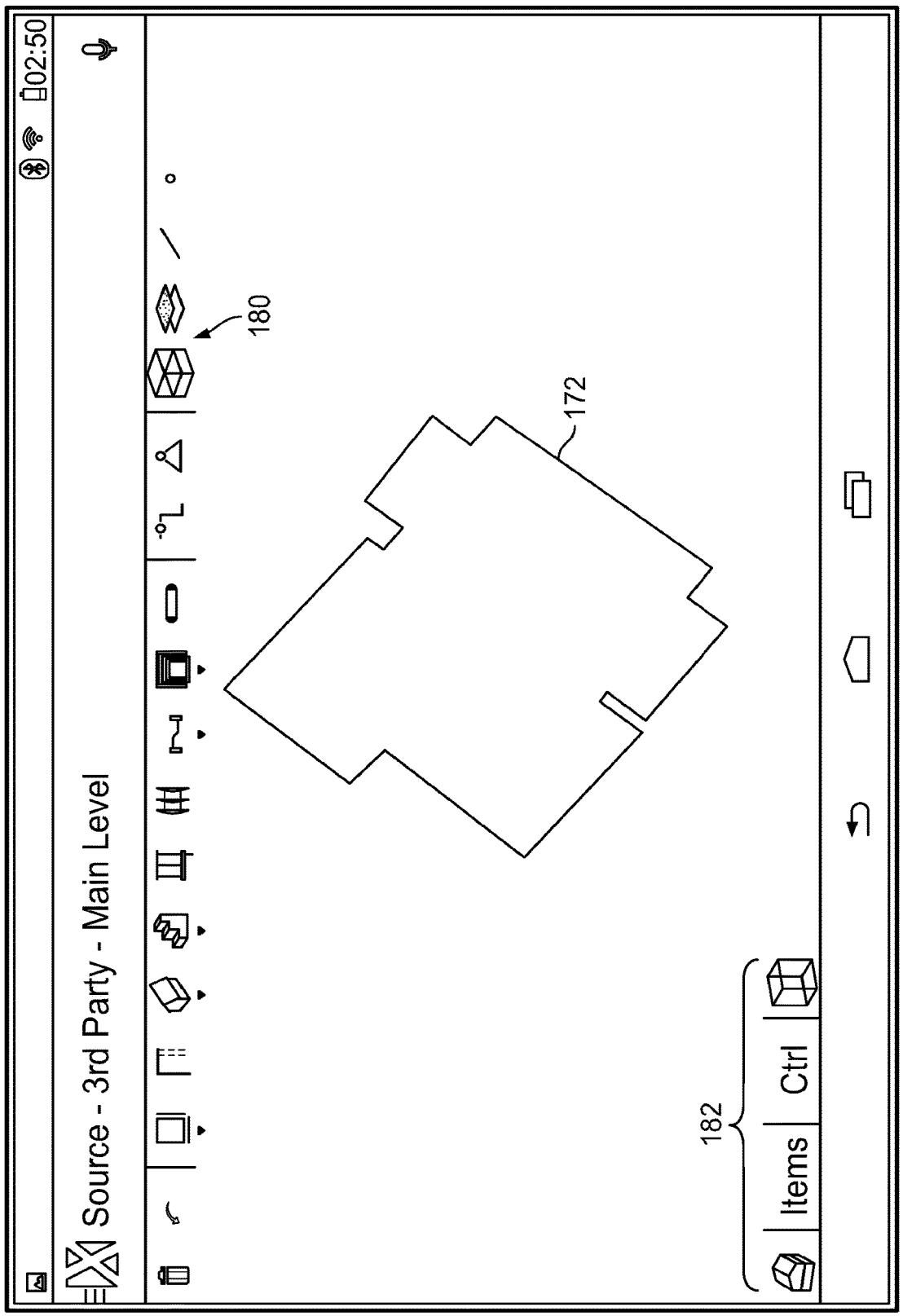

In steps 156 and 158, the generated floor contour and/or polyhedron can be displayed to the user, and optionally downloaded or exported by the user for use in another program (such as a computer-aided design (CAD) program), if desired. As illustrated in FIG. 9E, the generated polyhedron 172 is displayed by the system in a graphical user interface screen 170. The screen 170 also includes controls 174 for allowing the user to re-capture the room, if desired, finish capturing the room, send the captured polyhedron 172 to another program (such as the XACTIMATE software package by XACTWARE SOLUTIONS, INC.), and/or delete the polyhedron 172. Additionally, button 176 allows the user to view a top-down view of the polyhedron 172, and the "$1^{st}$ person" button 178 allows the user to view the polyhedron from a first person perspective view. Also, as shown in FIG. 9F, controls 180 allow the user to manipulate the polyhedron 172 (e.g., add features to the polyhedron, change wall/plane parameters (e.g., sizes, shapes, etc.). Additionally, controls 182 allow the user to perform other functions such as to view other items (e.g., other polyhedrons generated by the system).

It is noted that, in addition to identifying the basic size and shape of the structure, other relevant data can be extracted by the system as well. This step is illustrated in step 82 of FIG. 4. For example, for indoor rooms, the type of room could be identified as well as the layout and dimensions. Identification of the following small-scale features can be accomplished by training and utilizing neural networks (e.g., deep convolutional neural networks): living rooms, dining rooms, kitchens, bathrooms, bedrooms, garages, living vs. non-living spaces, flooring materials (carpet, tile, hard wood, cement, linoleum), wall materials (drywall, brick, stone, wood panel), etc. Additionally, the following specific wall features could be identified: windows, doors, passthrough from one room to another, baseboard and crown molding, columns, pillars, etc. Other significant features which could be extracted include: stoves, toilet bowls, sinks, electrical outlets, lighting fixtures, smoke alarms, thermostats, sprinklers, HVAC vents, etc. In addition, personal items could also be identified. These include: furniture, televisions/home electronics, lamps, appliances, books, etc. Still further, with appropriate sensors, the following types of damage may also be detected: mold, dry rot, termites, water damage, structural issues, etc.

Once the 3D models and all associated data have been extracted, this information can be made available through a database maintained by the system. The information can also be requested by specifying an individual property via an address, a geocode, etc. The information can also be aggregated and reports generated on multiple structures. For example, the system could be queried to display a list of all properties in postal code 84097 that have more than 4,000 square feet of living space and a pool. Properties in the database can be viewed online or on any mobile or desktop device.

Figure 10:
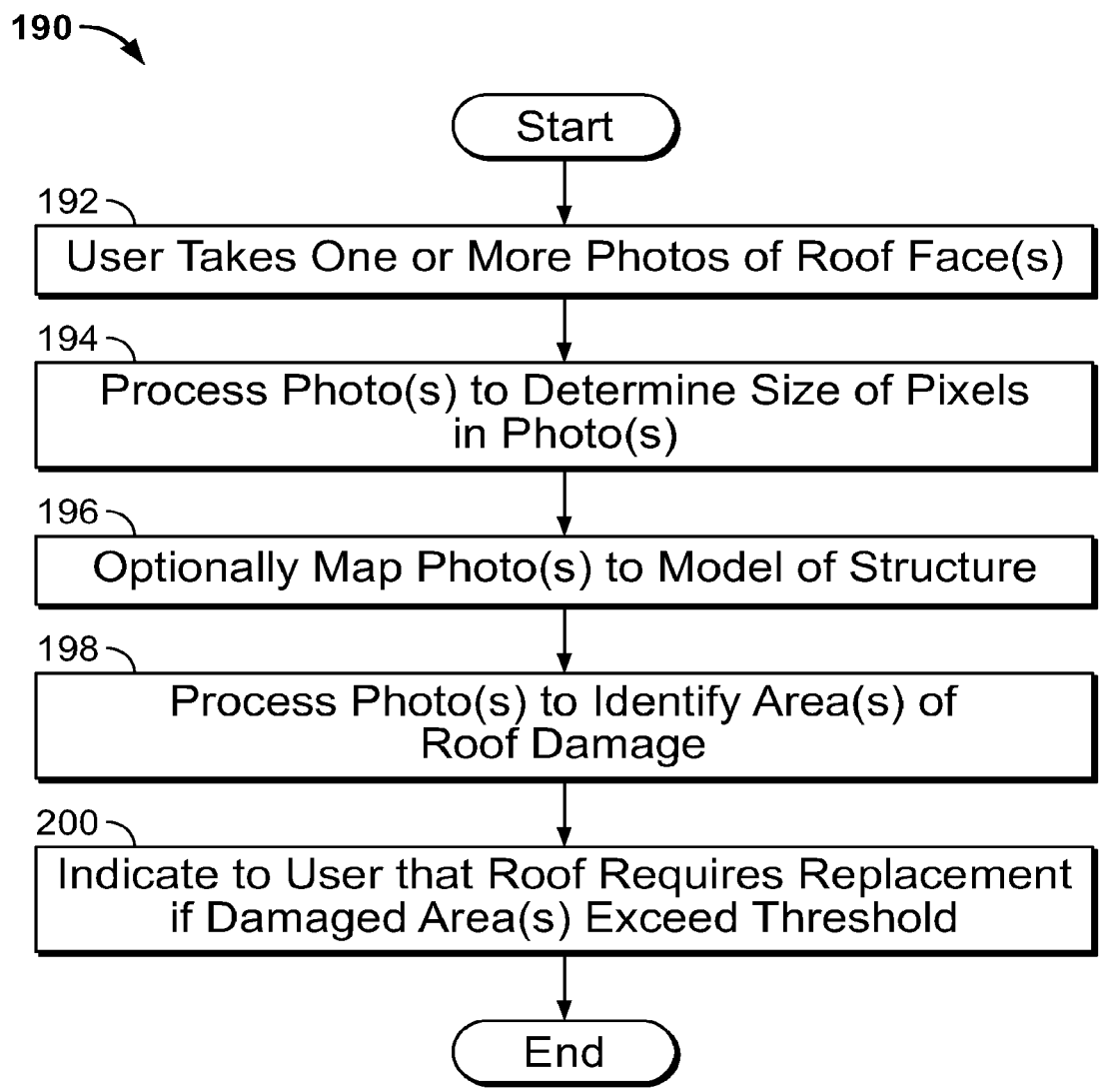
FIG. 10 is a flowchart illustrating processing steps carried out by the system for detecting and identifying damage to roof surfaces of a structure.

FIG. 10 is a flowchart illustrating processing steps, indicated generally at 190, for identifying areas of damage in roof surfaces of a structure. It is assumed that, prior to steps 190 being carried out, the system has already modeled a structure in accordance with the present disclosure. Beginning in step 192, the user takes one or more photos of the roof face(s). This can be accomplished using a digital camera, mobile device, or UAV/UAS. Next, in step 194, the system processes the images (photos) and determines the size of the pixels in the images. This can be accomplished in multiple ways. For example, a target of a known size can be placed on the faces prior to taking the photos and is included in the imagery. The target can be anything from a sticker to a piece of paper, etc. The target should be something that can be easily identified and measured with common CV algorithms—a QR code or similar works well, but it could be a logo, etc. SIFT (Scale Invariant Feature Transform), SURF (Speeded Up Robust Features), Hough transform and other algorithms could also be used. Further, if multiple photos are taken and there is additional metadata associated with the photos (including, but not limited to GPS location, accelerometer/gyroscope/compass readings, etc.), such metadata may be able to be used to determine scale in combination with additional configuration on the device or camera. Moreover, it is noted that step 194 could be carried out by determining physical camera characteristics such as focal length and pixel size., and/or by identifying photo geolocation using sensors from a user device such as a GPS receiver, accelerometer, compass, etc.

In step 196, the system optionally maps the imagery to a data model. For example, it is possible to extract only the portions of the imagery that are roof and wall faces, or attempt to to segment the images using roof/wall material detection algorithms or known "grabcut" algorithms. These imagery clips could be sent through neural networks/algorithms to identify possible areas of wind and hail damage and can return a list of coordinates tied to the imagery where the damage is suspected. The user can then be walked through a wizard-like process where they see the possible damage locations highlighted and review, edit and confirm the results. It is noted that step 196 could be carried out by projecting the property in three dimensions in the photo. For each roof plane in the photo, the system could identify suspected damaged areas using segmentation and neural networks to classify suspected areas as corresponding to actual damage, as well as identifying importance of the damage.

In step 198, the system processes the photo(s) to identify areas of roof damage. Based on the number of shingles damaged and pre-defined threshold parameters, the system can determine whether a particular face needs to be repaired or replaced. As shown in step 200, the areas requiring repair can be displayed to the user, if desired. The damaged area information could also be utilized to obtain full estimate details and produce a line item and labor list detailing the costs to do the repairs, using another software package such as the PROPERTY INSIGHT package by XACTWARE SOLUTIONS, INC.

Figure 11:
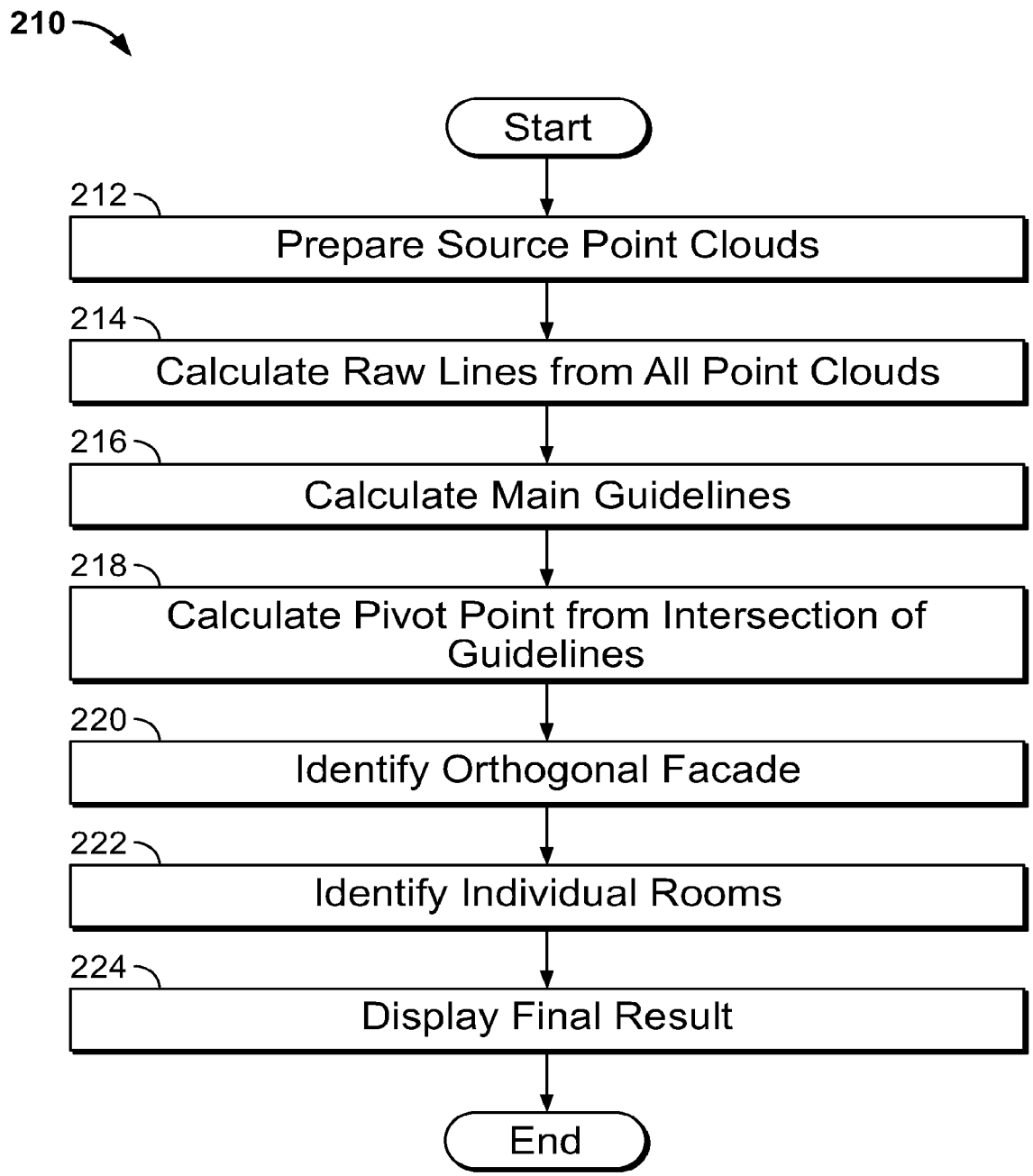
FIG. 11 is a flowchart illustrating additional processing steps carried out by the system for identifying individual rooms and floor plans from point cloud data.

FIG. 11 is a flowchart illustrating additional processing steps, indicated generally at 210, that can be carried out by the system for extracting floor plans from point cloud data. In describing the steps 210 of FIG. 11, reference is also made to the screenshots illustrated in FIGS. 12A-12H. Beginning in step 212, the system prepares source point clouds for processing from the system. This can be accomplished by removing Z-axis data from the points in the point cloud so that they are in the same plane, and by removing outliers and non-wall points. This step is illustrated in screenshot 250 in FIG. 12A. Then, in step 214, the system calculates raw lines from all point clouds processed by the system. This can be accomplished by calculating base lines from the X-Y point cloud data, using the following steps: clusterizing every point cloud by normal data, clusterizing every cluster by region growing and segmentation, calculating the concave hull for every cluster, and calculating the maximum segment from every cluster. This step is illustrated in screenshot 252 in FIG. 12B.

In step 216, the system calculates main guidelines. This can be accomplished by calculating the most important axis from the point cloud data and rotating the model so that it is aligned with Cartesian lines, splitting raw lines and grouping them over horizontal and vertical lines, identifying line subgroups by adjacency, creating a guideline per subgroup, removing outliers from raw lines using the guidelines, and calculating main guidelines using the filtered lines. This step is illustrated in screenshot 254 in FIG. 12C. Next, in step 218, the system calculates a pivot point from the intersection of the guidelines. This is illustrated in screenshot 256 in FIG. 12D. Next, in step 220, the system identifies an orthogonal façade for the structure, as illustrated in screenshot 258 in FIG. 12E. This can be accomplished by calculating the convex hull from the guidelines, refining the convex hull using pivot points, calculating the orthogonal façade from the refined convex hull, and identifying whether each segment is a convex or concave line strip if the segment is not horizontal or vertical (depending on whether the closest pivot points are inside or outside of the convex hull).

Figure 12A:
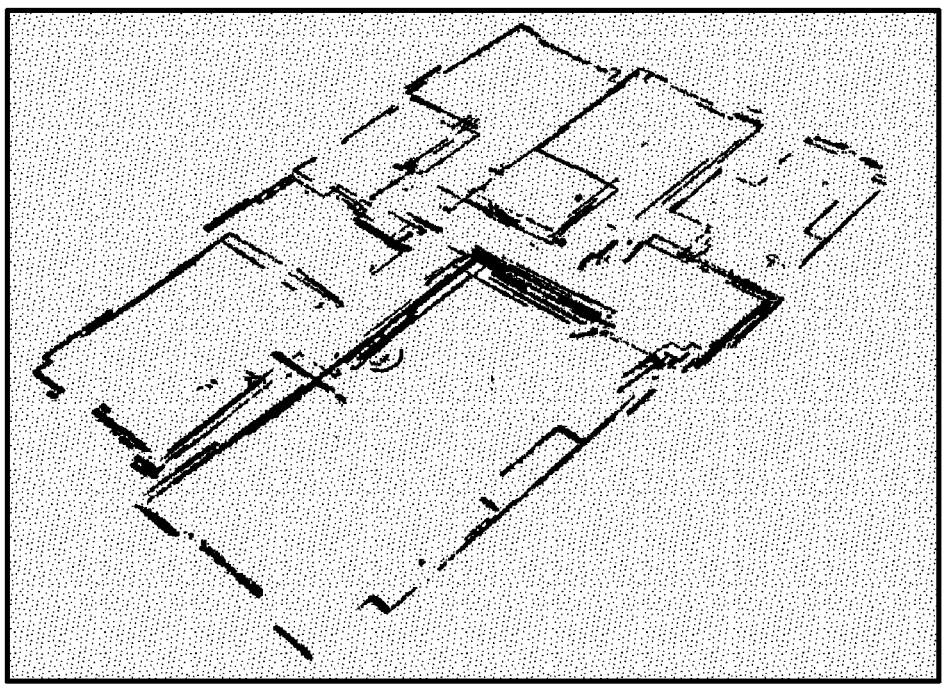
FIGS. 12A-12H are screenshots illustrating the processing steps of FIG. 11.
Figure 12B:
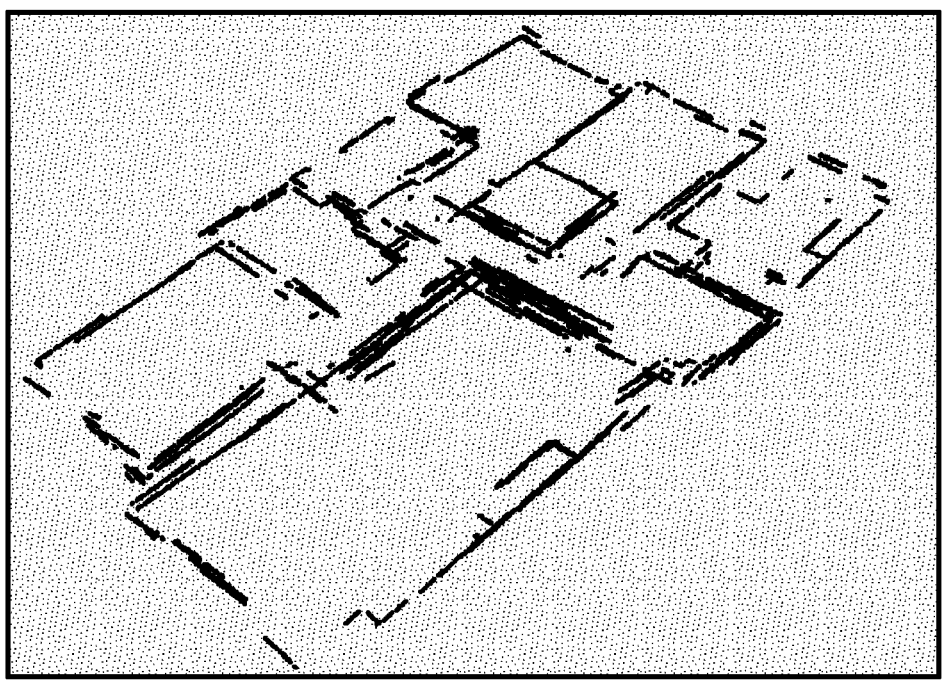
Figure 12C:
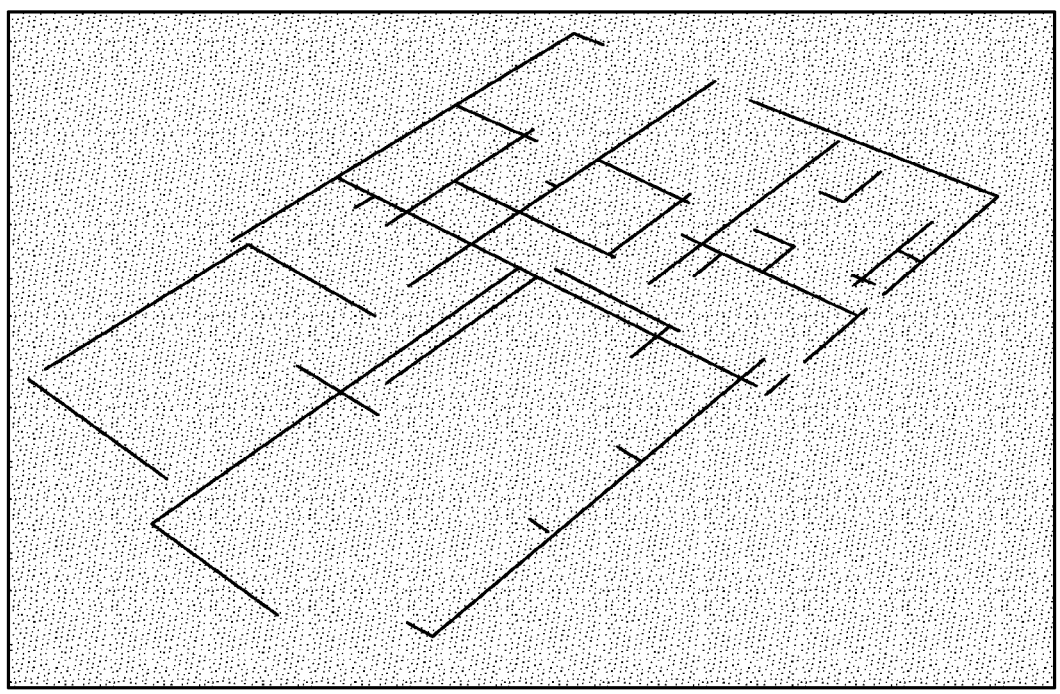
Figure 12D:
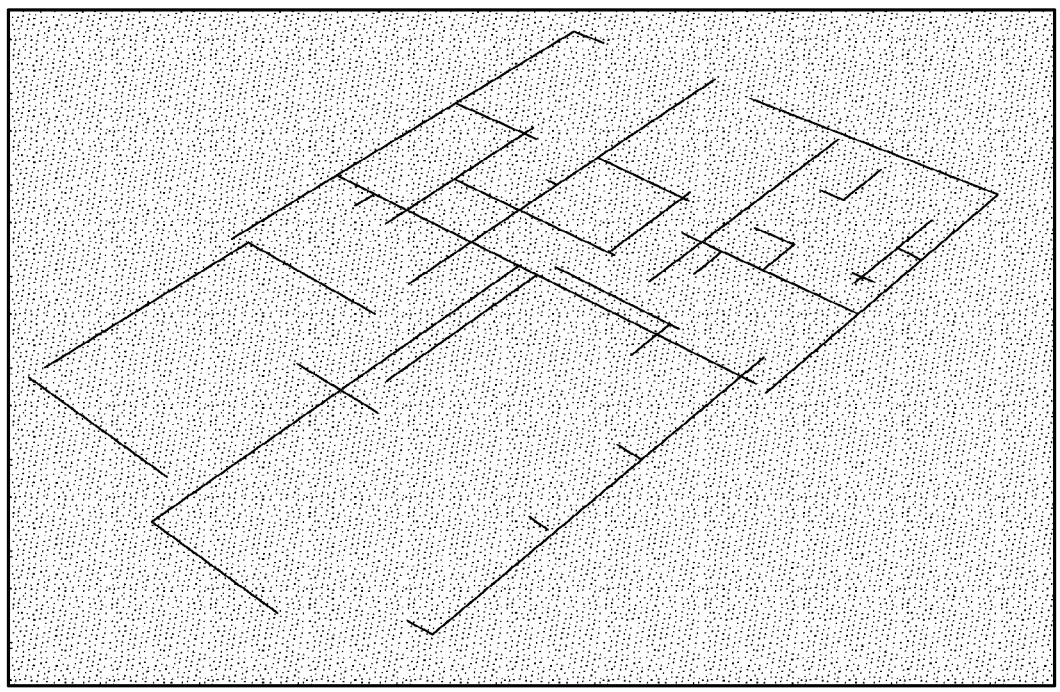
Figure 12E:
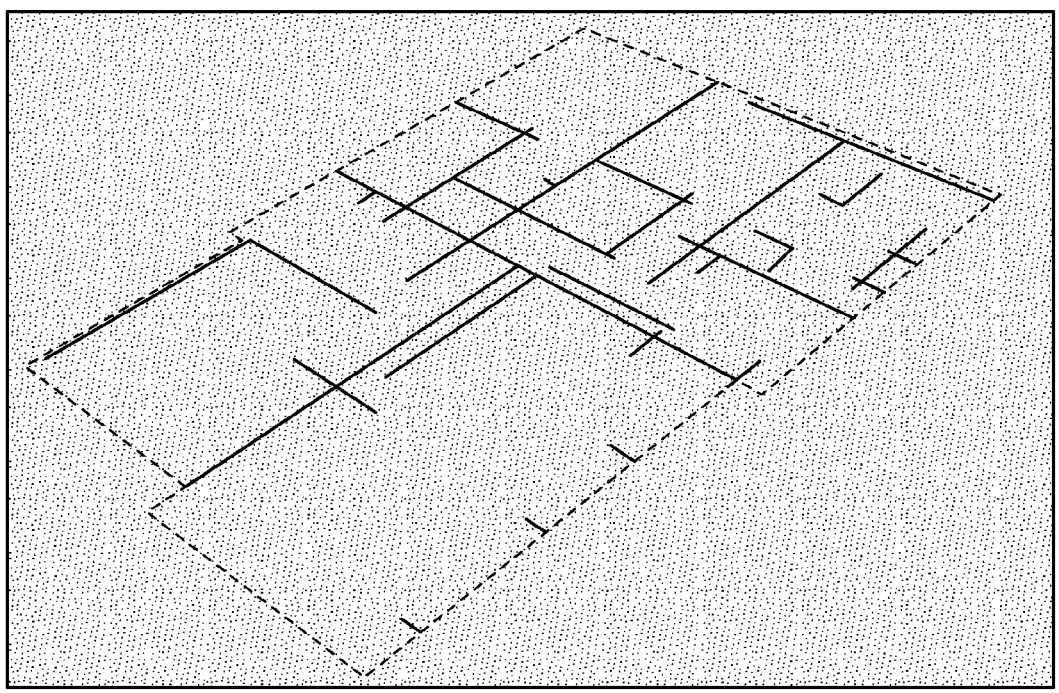
Figure 12F:
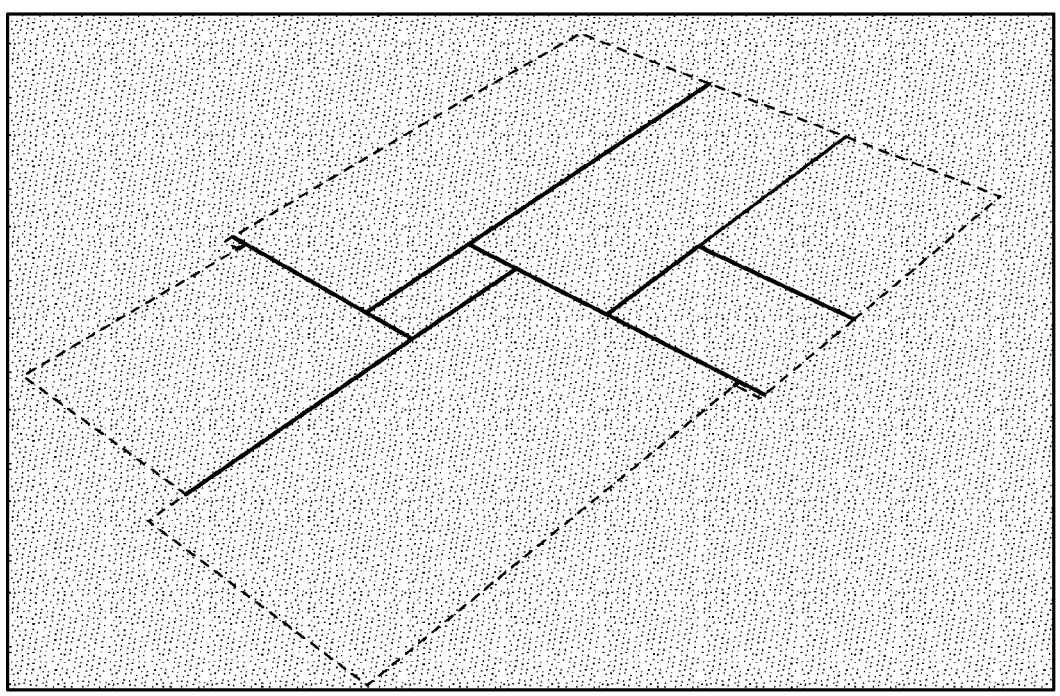
Figure 12G:
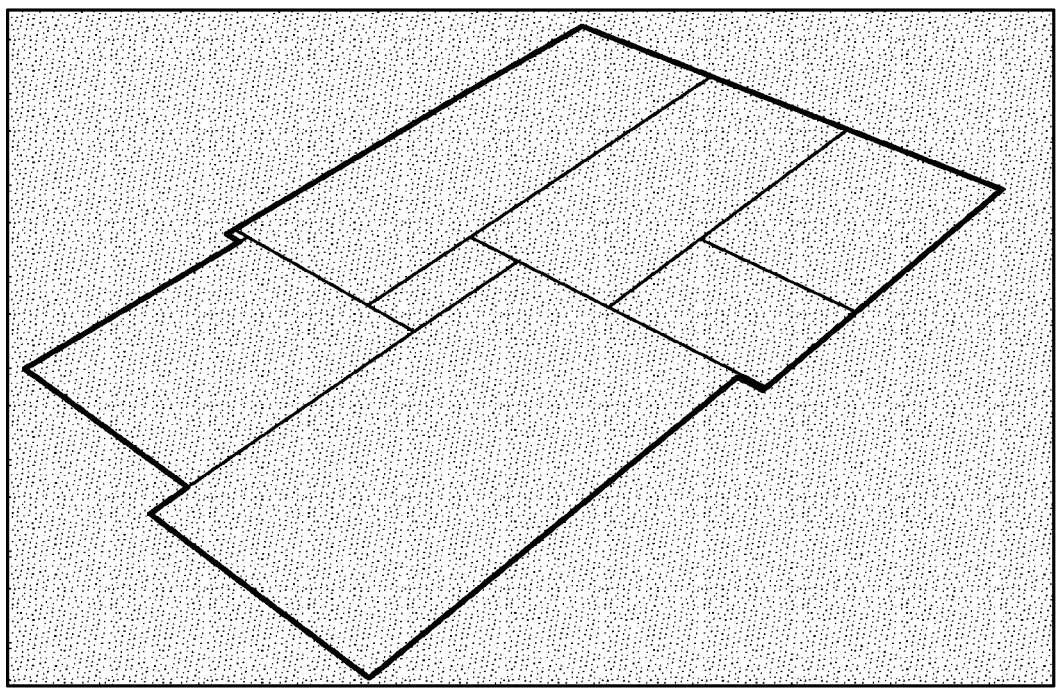
Figure 12H:
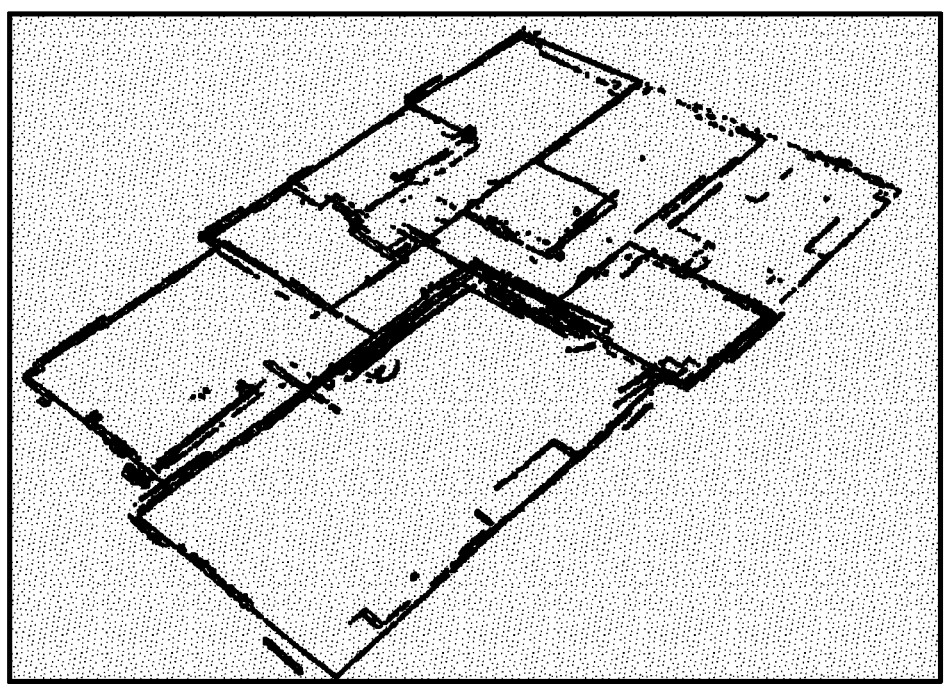
Figure 13:
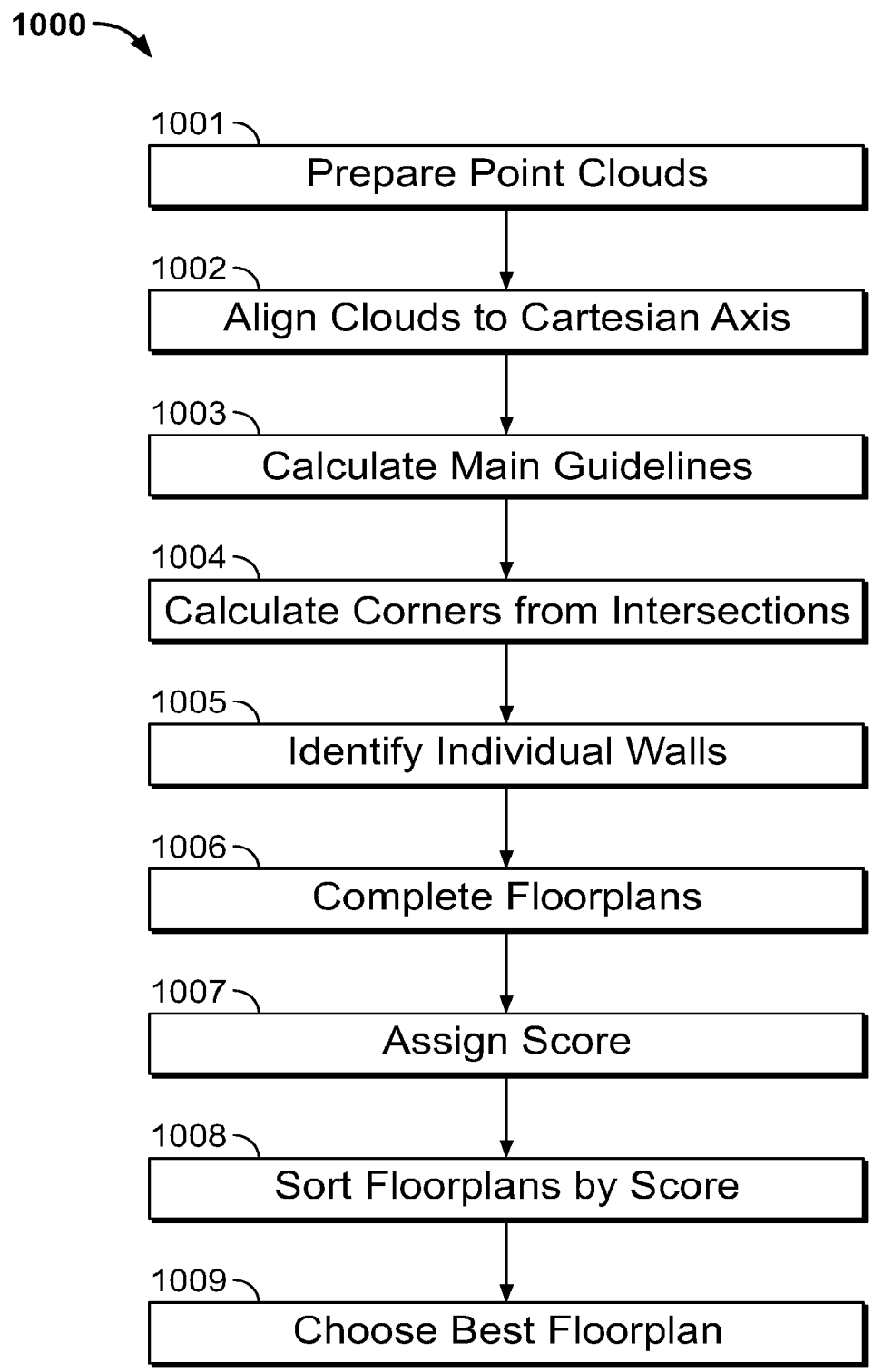
FIG. 13 is a flowchart illustrating another embodiment of the present disclosure for generating floorplans from point cloud data.

In step 222, the system identifies individual rooms, as shown in screenshots 260-262 in FIGS. 12F-12G. This can be accomplished by: defining rooms from the guidelines and the pivot points by using the pivot points as potential corners of the rooms and using the guidelines to obtain coverage of the potential room; calculating all potential rooms and associated coverage and identifying a rectangular room with the most coverage found; and repeating this step until the most coverage of a room below a threshold is obtained. Finally, in step 224, the system displays the final result. As shown in the screenshot 264 in FIG. 12H, the identified rooms could be superimposed on the raw point cloud data.

Figure 14A:
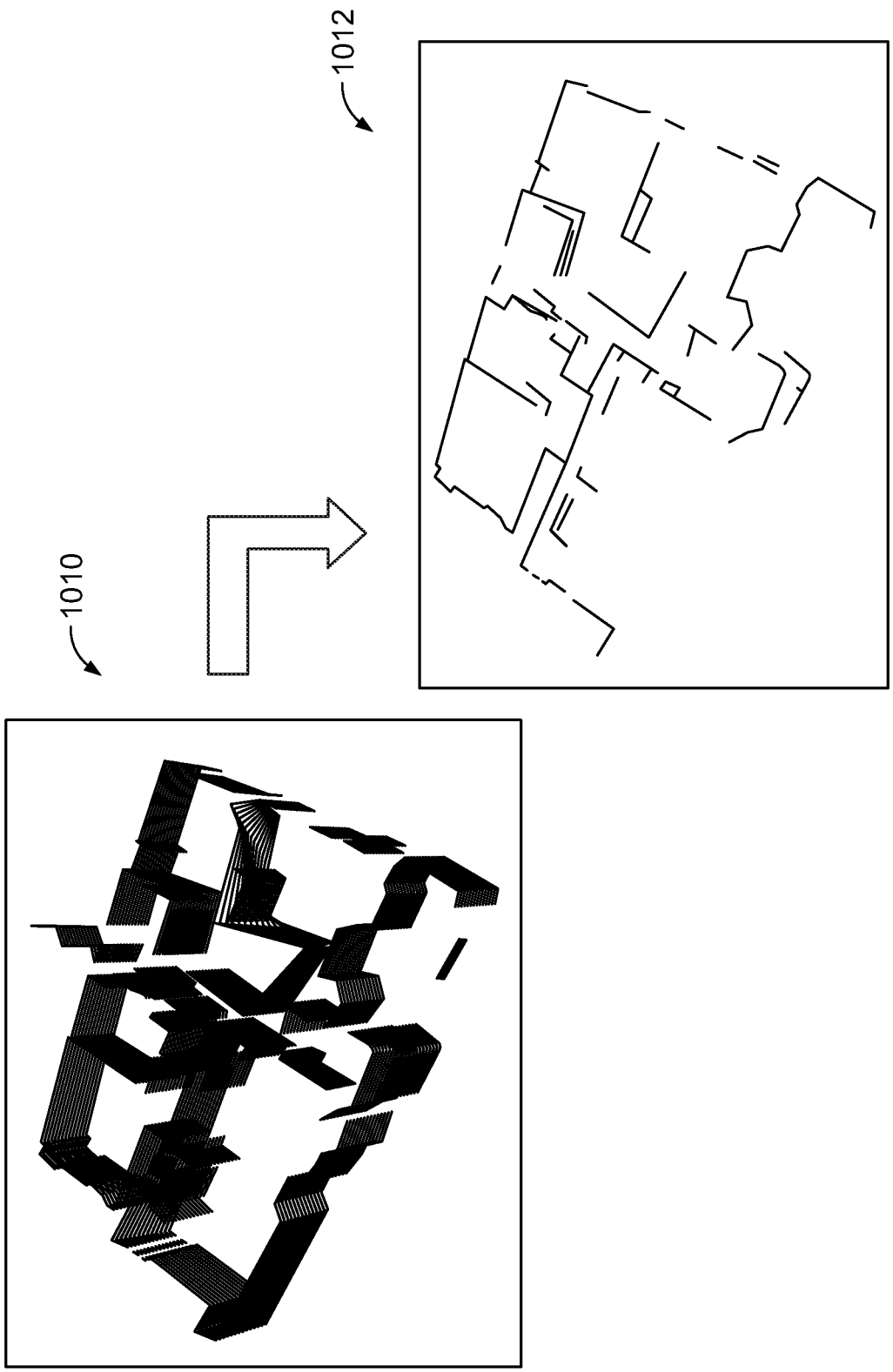
FIGS. 14A-14H are screenshots illustrating the processing steps of FIG. 13.
Figure 14B:
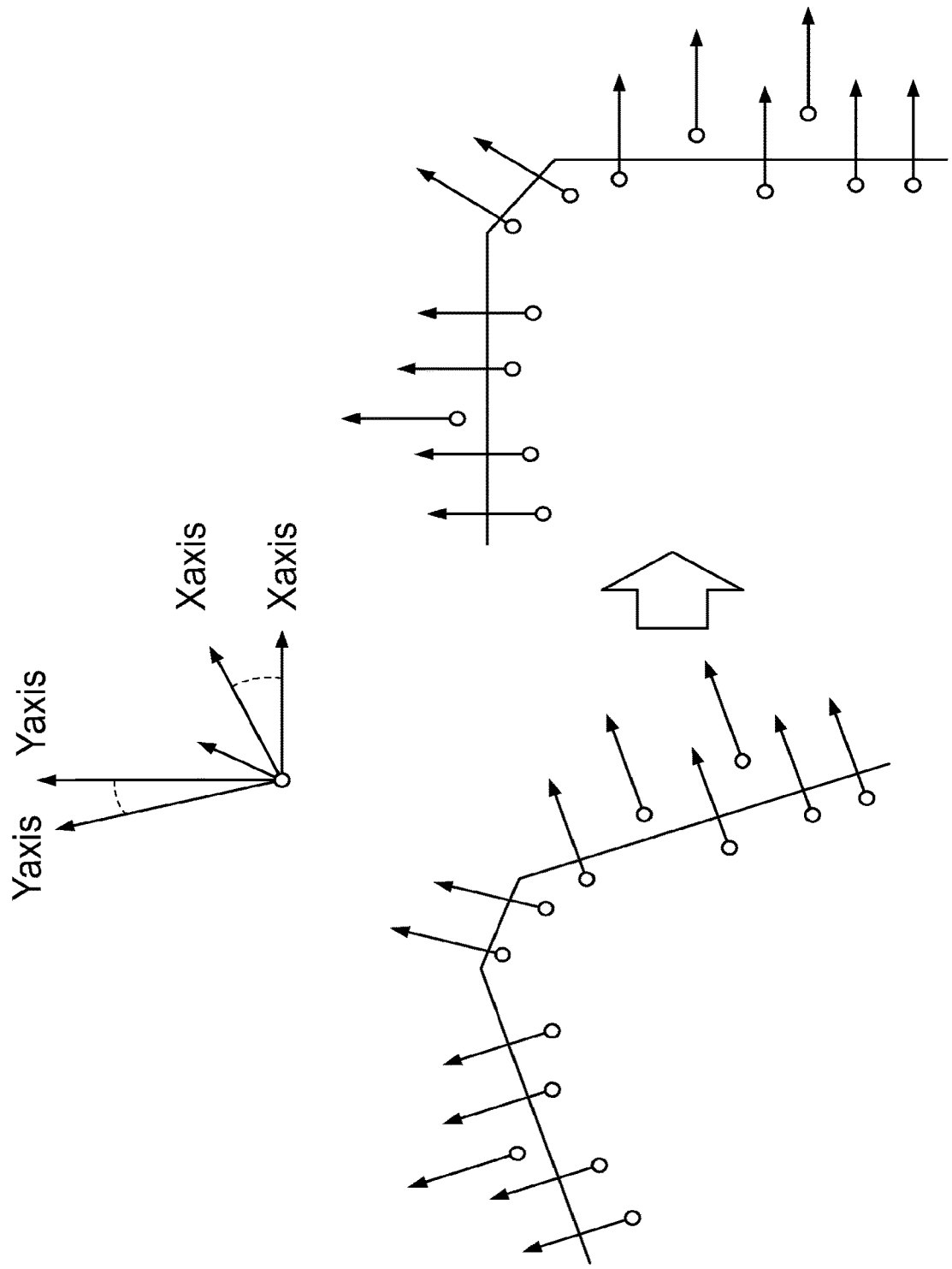
Figure 14C:
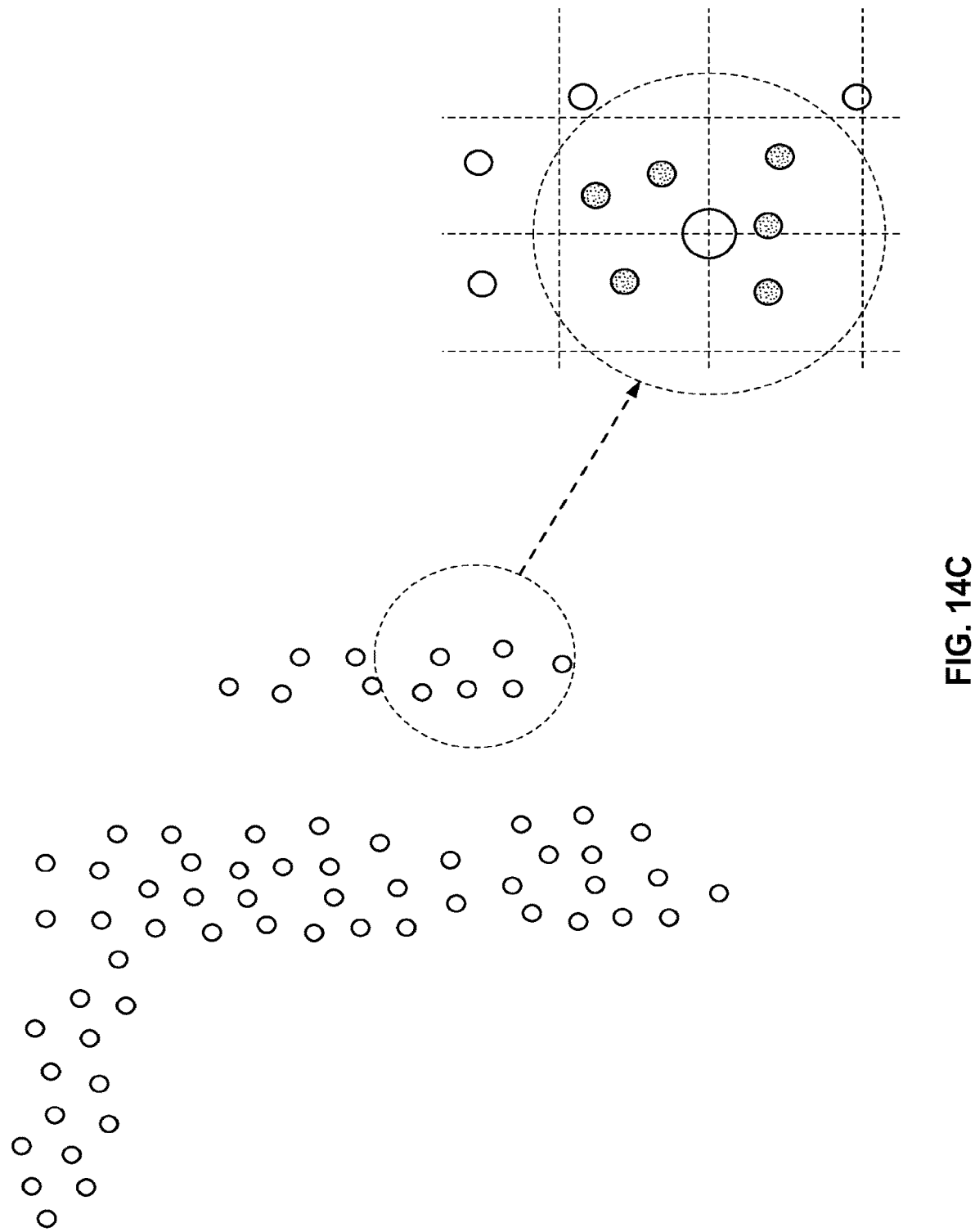
Figure 14D:
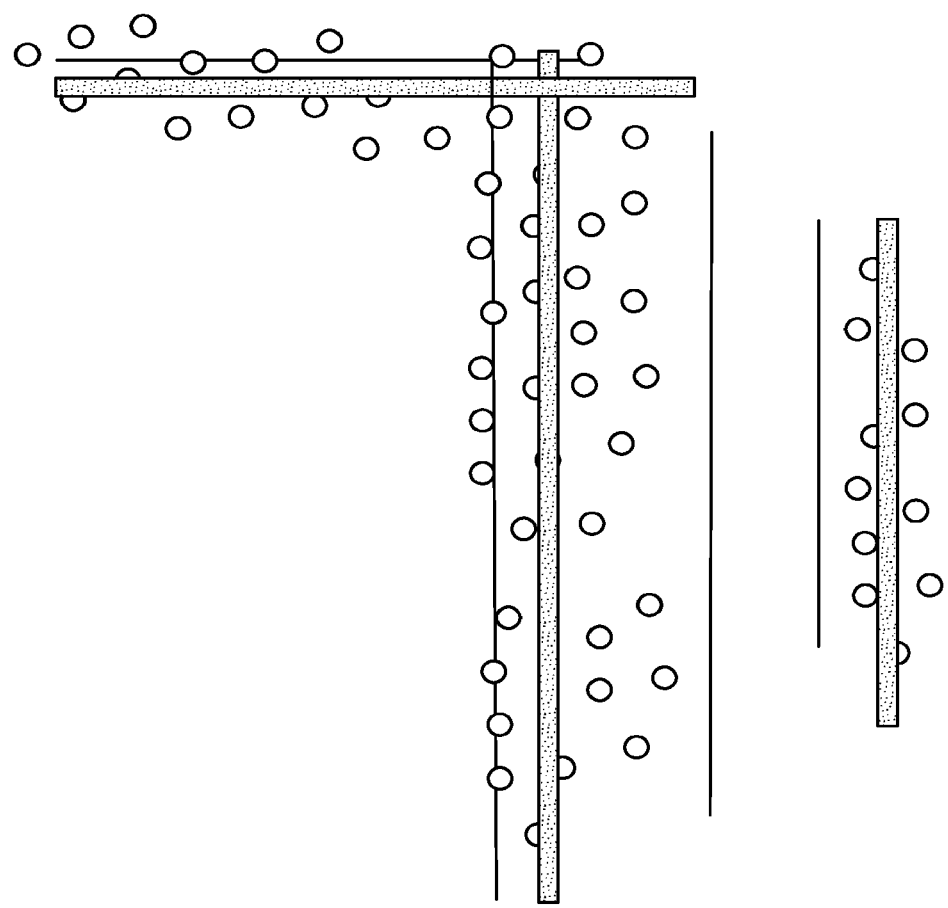

Referring to FIGS. 13 and 14A-14H, shown are additional processing steps in accordance with another embodiment of the present disclosure, indicated generally at 1000, for automatically identifying a floor plan for a room from point cloud data. Beginning in step 1001, the system prepares the point cloud data to extract point cloud normals, to remove outliers, and to remove clearly non-wall points. This can be accomplished using a PCL algorithm. Then, the system removes Z coordinates so that geometry is in a two-dimensional (2-D) space, as shown the images 1010-1011 of FIG. 14A. In step 1002, PCL can be used on point data to extract the main axis for every cloud. Then, all point clouds are rotated so that all points are aligned with a Cartesian axis, as shown in FIG. 14B. Then, in step 1003, the system creates a fine mesh horizontal grid which covers the entire point cloud, assigns values to the grid cells, and calculates main guidelines. As illustrated in FIG. 14C, the values correspond with the number of points from the cloud which project onto the cell in the horizontal grid (e.g., flattening the point cloud). Lines are created on the grid based on consecutive cells with point population. These lines are weighted based on cell point population and intersections with neighbor lines, etc. As shown in FIG. 14D, it can be seen that these lines are filtered and adjusted to better fit the real world, displacing them a bit out of the grid. Once this information is obtained, the grid is no longer necessary.

Figure 14E:
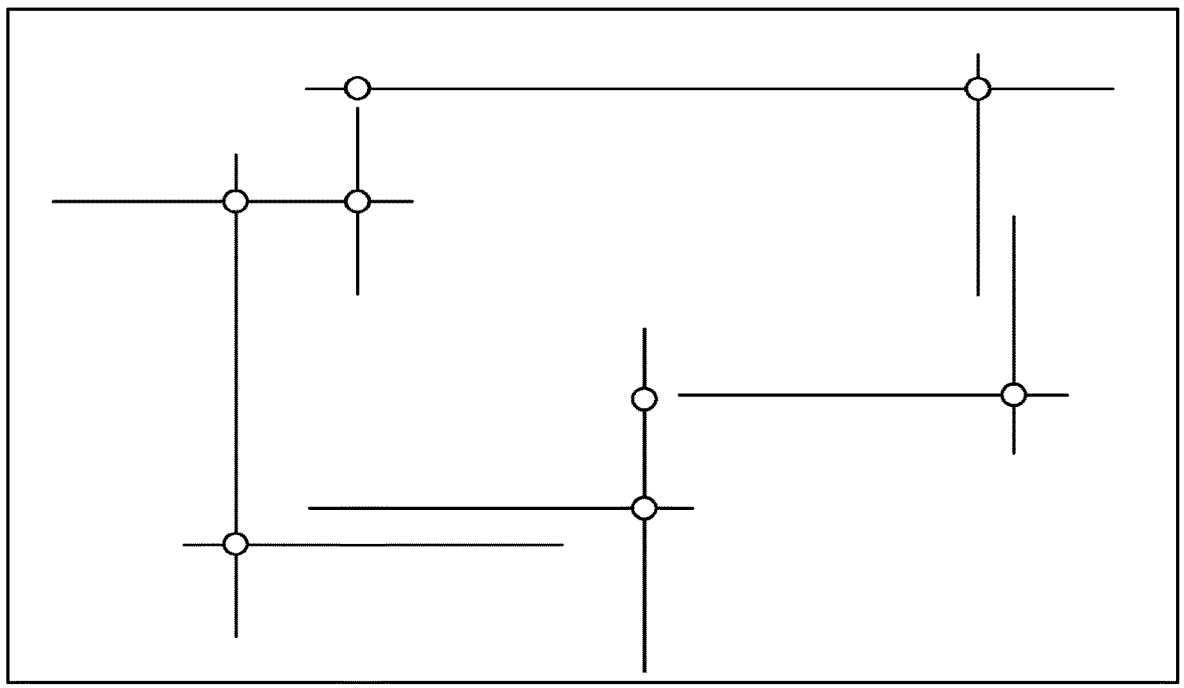
Figure 14F:
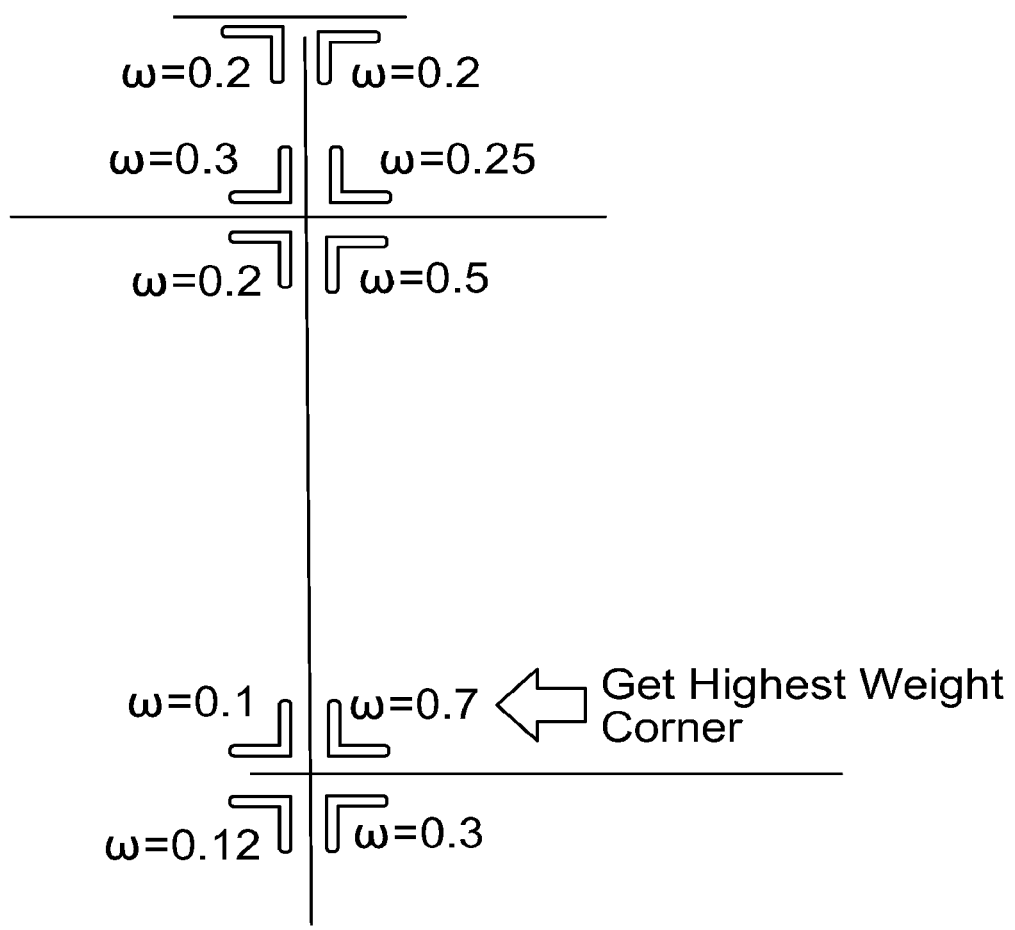
Figure 14G:
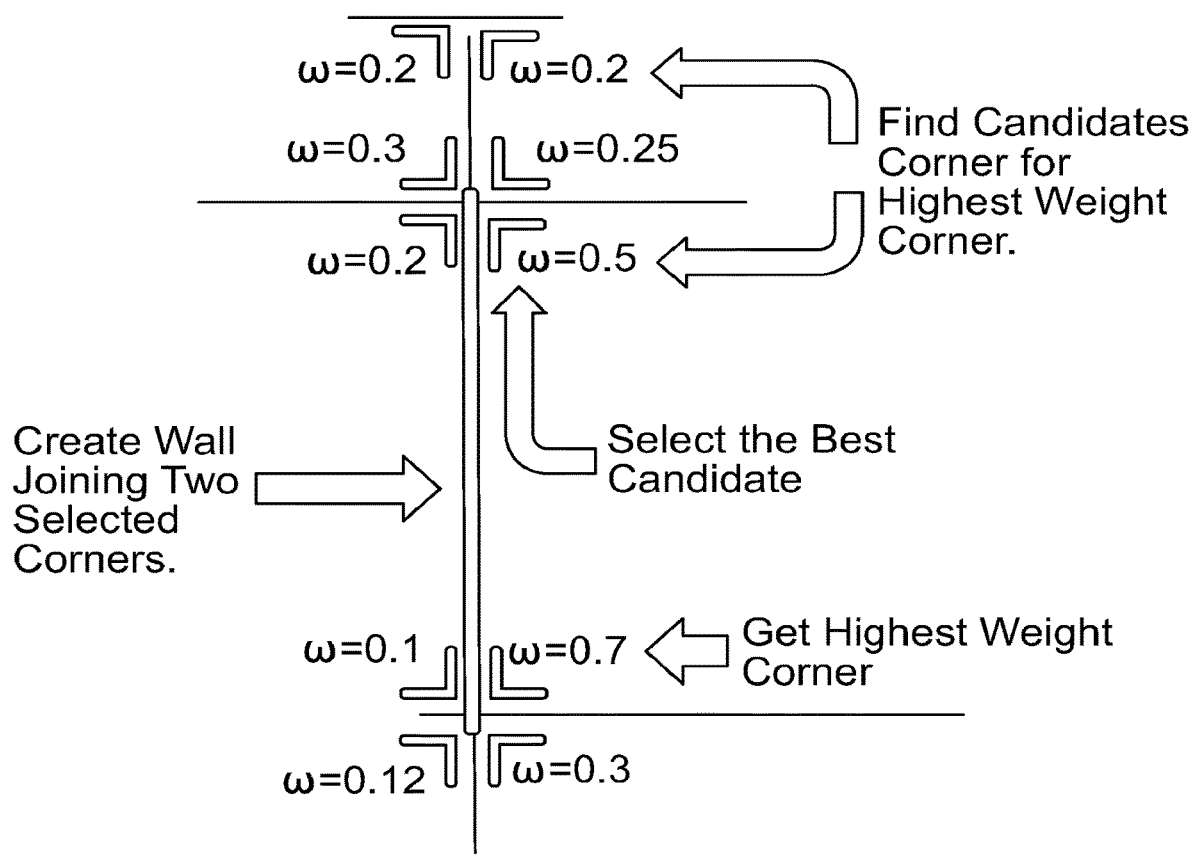
Figure 14H:
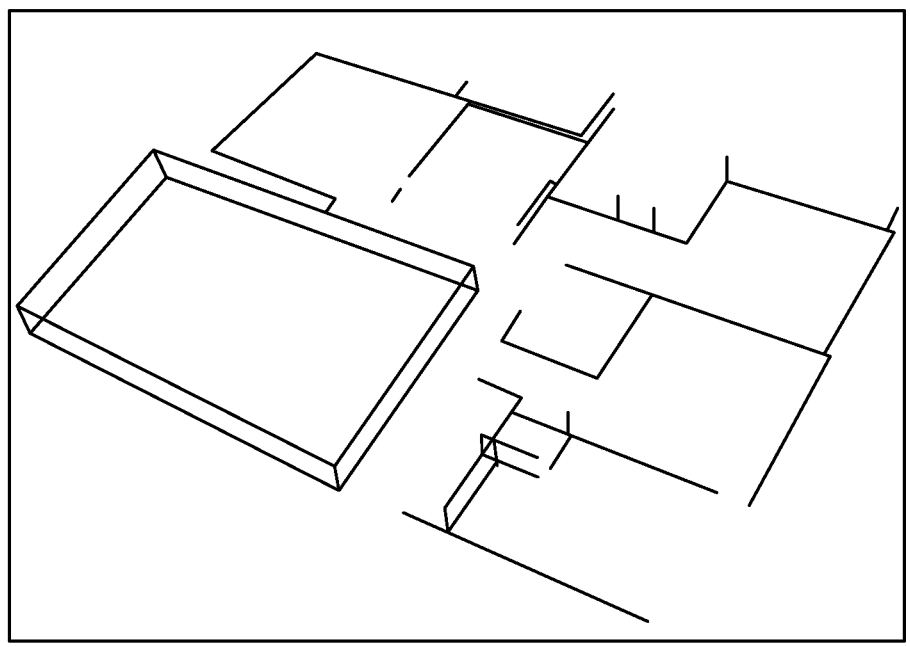

In step 1004, lines are extended and trimmed to create intersections with each other, as illustrated in FIG. 14E. Then, each intersection is considered as four quadrant, or eight octants, and each one is classified as a corner candidate. Each quadrant is weighted depending on multiple factors, including but not limited to, line weight, line extensions/trimmings that may be required to create intersections, angles between lines, etc. This process is illustrated in FIG. 14F. In step 1005, the walls are identified by joining corners with existing lines, and maximizing weight sums of corners and lines, as illustrated in FIG. 14G. This will generate a floorplan candidate as illustrated FIG. 14H. In step 1006, further analysis can be done on each room to determine completeness. Completeness can be determined using additional evidence from point clouds, as needed. Several floor plan candidates can be generated with different levels of confidence. In step 1007, the system assigns a score to each possible floor plan. The score reflects how well the edges of the floor plan line up with the input point cloud. Then, in step 1008, the system sorts the floorplans by scores. In step 1009, system identifies the floor plan having the highest score as the most likely to reflect the actual floor plan of the room.

It is noted that the system of the present disclosure could compensate for the presence of objects in a space undergoing floorplan estimation. For example, if particular objects (such as appliances, etc.) have known measurements, then the system can compensate for the presence of such objects, and/or include estimates of such objects into floorplans generated by the system. Such measurements could be obtained by looking up dimensions of objects (e.g., refrigerators, stoves, washing machines, toilets, etc.) in a database using detected makes/brands of such objects. Further, the system could utilize measurements of other objects, such as countertop measurements, in order to estimate measurements of room features, such as wall measurements. Still further, the floorplans estimated by the present system could be utilized to estimate other parameters of a particular structure, such as the type of construction of the structure. Additionally, it is contemplated that previous (stored) information relating to building/construction materials could be utilized with the system in order to predict materials in a particular structure undergoing estimation by the system. Finally, it is noted that the system could generate multiple floorplans of a particular structure, which floorplans could then be "assembled" to form a model of the entire structure (e.g., assembling floorplans of each room in the structure until an entire model of the structure is generated).

Having thus described the system and method in detail, it is to be understood that the foregoing description is not intended to limit the spirit or scope thereof. It will be understood that the embodiments of the present disclosure described herein are merely exemplary and that a person skilled in the art may make any variations and modification without departing from the spirit and scope of the disclosure. All such variations and modifications, including those discussed above, are intended to be included within the scope of the disclosure.

We claim:

1. A system for generating computerized models of structures, the system comprising:
    an input device including one or more sensors, the input device configured to:
    capture, via the one or more sensors, raw data of at least one structure disposed in a physical space and including a plurality of large-scale structure features and a plurality of small-scale structure features, wherein the large-scale structure features and small-scale structure features include geometric features;
    a computing system coupled to the input device and including, a processor, a display, and a memory, the computing system programmed to:
    receive the raw data;
    process the raw data using a data fusion process to produce fused data, said data fusion process performing frame registration on frames of the raw data;
    extract the geometric features from the fused data;
    reconstruct the plurality of large-scale structure features using the extracted geometric features;
    reconstruct the small-scale structure features using the extracted geometric features;
    store the large-scale structure features and small-scale features;
    generate a three-dimensional visual representation of a reconstructed model of the at least one structure using the large-scale structure features and small-scale features; and
    display, on the display, the three-dimensional visual representation of the reconstructed model of the at least one structure,
    wherein input device captures the raw data by:
    scanning, via the one or more sensors of the input device, the physical space;
    detecting whether the input device is within the at least one structure;
    capturing, via the one or more sensors, the raw data of the at least one structure; and
    determining the captured raw data is more than or equal to a specified amount of raw data, wherein the specified amount of raw data is determined based on whether the input device is within the at least one structure.

2. The system of claim 1, wherein the geometry features include one or more of: edges lines, planes, points and corners.

3. The system of claim 1, wherein the large-scale structure features include one or more of: walls, ceilings and floors.

4. The system of claim 1, wherein the computing system reconstructs the large-scale structure features using the extracted geometry features by:

identifying one or more of the extracted geometry features corresponding a ceiling and floor of the at least one structure;
identifying one or more of the extracted geometry features corresponding to one or more walls of the at least one structure;
straightening the one or more walls;
identifying adjacent walls from the one or more walls; and
squaring an angle formed by adjacent walls.

5. The system of claim 1, wherein the small-scale structure features include one or more of: room types, materials, wall features and fixtures.

6. The system of claim 1, wherein a type of raw data is one or more of: RGB image data, infrared image data, mobile sensors data, point cloud data, LIDAR data, global positioning system (GPS) data, X-ray data, magnetic field data, and depth maps data.

7. The system of claim 6, wherein the computing system is programmed to:
detect the type of raw data is point cloud data, in response to receiving the raw data;
identify one or more major planes in the raw data;
flatten the one or more planes by projecting points of the one or more plane onto the one or more planes;
identify at least one floor plane and at least one wall plane;
identify one or more corner points formed by the joining of the at least one floor plane and at least one wall plane;
generate a fine mesh horizontal grid including a plurality of cells;
assign values to the plurality of cells in the grid;
identify one or more floor plans including a plurality of edges, based on the identified one or more corner points; and
assign a score to each of the one or more floor plans, wherein the score is calculated based on a comparison of the plurality of edges and the plurality of the cells in the grid.

8. The system of claim 7, wherein the computing system is configured to identify the at least one floor plane and the at least one wall plane based on a user interaction with the display.

9. The system of claim 6, wherein the computing system is programmed to:
detect the type of raw data is point cloud data, in response to receiving the raw data;
calculate one or more raw lines from the point cloud data;
calculate main guidelines based on the one or more raw lines;
calculate a pivot point from one or more intersection points of the main guidelines;
identify an orthogonal façade for the at least one structure;
identify one or more rooms of the at least one structure based on the main guidelines, the pivot point and orthogonal façade;
generate a visual representation of the one or more rooms of the at least on structure; and
display on the display the visual representation of the one or more rooms of the at least one structure.

10. The system of claim 6, wherein the computing system is programmed to:
detect the type of raw data is point cloud data, in response to receiving the raw data;
extract a main axis from the point cloud data;
create a fine mesh horizontal grid including a plurality of cells;
assign a value to each of the plurality of cells;
calculate main guidelines;
calculate corners based on one or more intersection points of one or more lines;
identify one or more walls of the least one structure based on the calculated corners;
generate a first floor plan of the at least one structure;
compare a second floor plan to the first floor plan of the at least one structure; and
assign a score to the second floor plan based on the comparison of the second floor plan and the first plan of the at least one structure.

11. The system of claim 6, wherein the computing system is programmed to:
detect the type of raw data is point cloud data captured at a first-person perspective view, in response to receiving the raw data;
receiving a user interaction on the display identifying at least one wall of the at least one structure in the point cloud data;
project an infinite ray into the point cloud data;
determine one or more intersection points of the infinite ray and the point cloud data;
execute a region growing plane algorithm based on the one or more intersection points of the infinite ray and the point cloud data;
extract at least one plane of the at least one wall in response to the execution of the region growing plane algorithm;
calculate one or more intersection points of the at least one wall and at least one floor or at least one ceiling of the at least one structure;
construct a floor contour or a polyhedron representing an assembly of at least one room of the at least one structure; and
display, on the display, the floor contour or the polyhedron.

12. The system of claim 1, further comprising an image capturing device coupled to the input device, the image capturing device configured to:
capture one or more images of a roof face of the at least one structure; and
transmit the one or more images of the roof face of the at least one structure.

13. The system in claim 12, wherein in response to displaying on the display the reconstructed model of the at least one structure, the computing system further programmed to:
receive the one or more images of the roof face of the at least one structure;
determine a pixel size of the one or more images;
map the one or more images to the reconstructed model of the at least one structure;
identify one or more areas of damage in the one or more images; and
determine an amount of the one or more areas of damage exceeds a predetermined threshold amount.

14. The system of claim 1, wherein the computing system is one of: a mobile device or a remote structure modeling server.

15. The system of claim 1, wherein the one or more sensors are one or more of: image capturing device, laser scanners, scanning range finders, RGB-D sensors, mobile sensors.

16. The system of claim 1, wherein the input device is one of: smart phones, tablet computers, laptop computers, wearable computers, robots or Unmanned Aerial Vehicle (UAVs).

17. A method for generating computerized models of structures, the method comprising:
- capturing, via an input device including one or more sensors, using the one or more sensors, raw data of at least one structure disposed in physical space and including a plurality of large-scale structure features and a plurality of small-scale structure features, wherein the large-scale structure features and small-scale structure features include geometric features;
- transmitting, via the input device, the raw data;
- receiving, via the computing system, the raw data;
- processing the raw data using a data fusion process to produce fused data, said data fusion process performing frame registration on frames of the raw data;
- storing, via the computing system, the fused data;
- extracting, via the computing system, the geometric features from the fused data;
- reconstructing, via the computing system, the plurality of large-scale structure features using the extracted geometric features;
- reconstructing, via the computing system, the small-scale structure features using the extracted geometric features;
- storing, via the computing system, the large-scale structure features and small-scale features;
- generating, via the computing system, a three-dimensional visual representation of a reconstructed model of the at least one structure using the large-scale structure features and small-scale features; and
- displaying, via the computing system, on the display the three-dimensional visual representation of the reconstructed model the reconstructed model of the at least one structure,
- wherein capturing the raw data further comprises:
- scanning, via the one or more sensors of the input device, the physical space;
- detecting, via the one or more sensors of the input device, whether the input device is within the at least one structure;
- capturing, via the one or more sensors of the input device, the raw data of the at least one structure; and
- determining, via the input device, the captured raw data is more than or equal to a specified amount of raw data, wherein the specified amount of raw data is determined based on whether the input device is within the at least one structure.

18. The method of claim 17, wherein reconstructing the large-scale structure features using the extracted geometry features further comprising:
- identifying, via the computing system, one or more of the extracted geometry features corresponding a ceiling and a floor of the at least one structure;
- identifying, via the computing system, one or more of the extracted geometry features corresponding to one or more walls of the at least one structure;
- straightening, via the computing system, the one or more walls;
- identifying, via the computing system, adjacent walls from the one or more walls; and
- squaring, via the computing system, an angle formed by adjacent walls.

19. The method of claim 17, wherein a type of raw data is one or more of: RGB image data, infrared image data, mobile sensors data, point cloud data, LIDAR data, global positioning system (GPS) data, X-ray data, magnetic field data, and depth maps data.

20. The method of claim 19, further comprising:
- detecting, via the computing system, the type of raw data is point cloud data, in response to receiving the raw data;
- identifying, via the computing system, one or more major planes in the raw data;
- flattening, via the computing system, the one or more planes by projecting points of the one or more plane onto the one or more planes;
- identifying, via the computing system, at least one floor plane and at least one wall plane;
- identifying, via the computing system, one or more corner points formed by the joining of the at least one floor plane and at least one wall plane;
- generating, via the computing system, a fine mesh horizontal grid including a plurality of cells;
- assigning, via the computing system, values to the plurality of cells in the grid;
- identifying, via the computing system, one or more floor plans including a plurality of edges, based on the identified one or more corner points; and
- assigning, via the computing system, a score to each of the one or more floor plans, wherein the score is calculated based on a comparison of the plurality of edges and the plurality of the cells in the grid.

21. The method of claim 19, further comprising:
- detecting, via the computing system, the type of raw data is point cloud data, in response to receiving the raw data;
- calculating, via the computing system, one or more raw lines from the point cloud data;
- calculating, via the computing system, main guidelines based on the one or more raw lines;
- calculating, via the computing system, a pivot point from one or more intersection points of the main guidelines;
- identifying, via the computing system, an orthogonal façade for the at least one structure;
- identifying, via the computing system, one or more rooms of the at least one structure based on the main guidelines, the pivot point and orthogonal façade;
- generating, via the computing system, a visual representation of the one or more rooms of the at least on structure; and
- displaying, via the computing system, on the display the visual representation of the one or more rooms of the at least one structure.

22. The method of claim 19, further comprising:
- detecting, via the computing system, the type of raw data is point cloud data, in response to receiving the raw data;
- extracting, via the computing system, a main axis from the point cloud data;
- creating, via the computing system, a fine mesh horizontal grid including a plurality of cells;
- assigning, via the computing system, a value to each of the plurality of cells;
- calculating, via the computing system, main guidelines;
- calculating, via the computing system, corners based on one or more intersection points of one or more lines;
- identifying, via the computing system, one or more walls of the least one structure based on the calculated corners;
- generating, via the computing system, a first floor plan of the at least one structure;
- comparing, via the computing system, a second floor plan to the first floor plan of the at least one structure; and assigning, via the computing system, a score to the second floor plan based on the comparison of the second floor plan and the first plan of the at least one structure.

23. The method of claim 19, further comprising:

detecting, via the computing system, the type of raw data is point cloud data captured at a first-person perspective view, in response to receiving the raw data;

receiving, via the computing system, a user interaction on the display identifying at least one wall of the at least one structure in the point cloud data;

projecting, via the computing system, an infinite ray into the point cloud data;

determining, via the computing system, one or more intersection points of the infinite ray and the point cloud data;

executing, via the computing system, a region growing plane algorithm based on the one or more intersection points of the infinite ray and the point cloud data;

extracting, via the computing system, at least one plane of the at least one wall in response to the execution of the region growing plane algorithm;

calculating, via the computing system, one or more intersection points of the at least one wall and at least one floor or at least one ceiling of the at least one structure;

constructing, via the computing system, a floor contour or a polyhedron representing an assembly of at least one room of the at least one structure; and displaying, via the computing system, on the display, the floor contour or the polyhedron.

24. The method of claim 17, further comprising:

capturing, via an image capturing device coupled to the input device, one or more images of a roof face of the at least one structure; and transmitting, via the input device, the one or more images of the roof face of the at least one structure.

25. The method in claim 24, wherein in response to displaying on the display the reconstructed model of the at least one structure, the method further comprising:

receiving, via the computing system, the one or more images of the roof face of the at least one structure;

determining, via the computing system, a pixel size of the one or more images;

mapping, via the computing system, the one or more images to the reconstructed model of the at least one structure;

identifying, via the computing system, one or more areas of damage in the one or more images; and determining, via the computing system, an amount of the one or more areas of damage exceeds a predetermined threshold amount.

26. A non-transitory computer readable medium storing computer executable instructions thereupon for generating computerized models of structures, the instructions when executed by a processor cause the processor to:

capture, via an input device including one or more sensors, using the one or more sensors, raw data of at least one structure disposed in a physical space and including a plurality of large-scale structure features and a plurality of small-scale structure features, wherein the large-scale structure features and small-scale structure features include geometric features;

transmit, via the input device, the raw data;

receive, via the computing system, the raw data;

processing the raw data using a data fusion process to produce fused data;

store, via the computing system, the fused data;

extract, via the computing system, the geometry features from the fused data;

reconstruct, via the computing system, the plurality of large-scale structure features using the extracted geometry features;

reconstruct, via the computing system, the small-scale structure features using the extracted geometry features;

store, via the computing system, the large-scale structure features and small-scale features;

generate, via the computing system, a three-dimensional visual representation of a reconstructed model of the at least one structure using the large-scale structure features and small-scale features;

display, via the computing system, on the display the three-dimensional visual representation of the reconstructed model of the at least one structure;

detect, via the computing system, the type of raw data is point cloud data, in response to receiving the raw data;

identify, via the computing system, one or more major planes in the raw data;

flatten, via the computing system, the one or more planes by projecting points of the one or more plane onto the one or more planes;

identify, via the computing system, at least one floor plane and at least one wall plane;

identify, via the computing system, one or more corner points formed by the joining of the at least one floor plane and at least one wall plane;

generate, via the computing system, a fine mesh horizontal grid including a plurality of cells;

assign, via the computing system, values to the plurality of cells in the grid;

identify, via the computing system, one or more floor plans including a plurality of edges, based on the identified one or more corner points; and assign, via the computing system, a score to each of the one or more floor plans, wherein the score is calculated based on a comparison of the plurality of edges and the plurality of the cells in the grid.

27. The non-transitory computer readable medium of claim 26, wherein reconstructing the large-scale structure features using the extracted geometry features, when executed by the processor, further cause the processor to:

identify, via the computing system, one or more of the extracted geometry features corresponding a ceiling and a floor of the at least one structure;

identify, via the computing system, one or more of the extracted geometry features corresponding to one or more walls of the at least one structure;

straighten, via the computing system, the one or more walls;

identify, via the computing system, adjacent walls from the one or more walls; and square, via the computing system, an angle formed by adjacent walls.

28. The non-transitory computer readable medium of claim 26, wherein a type of raw data is one or more of: RGB image data, infrared image data, mobile sensors data, point cloud data, LIDAR data, global positioning system (GPS) data, X-ray data, magnetic field data, and depth maps data.

29. The non-transitory computer readable medium of claim 28, wherein the instructions, when executed by the processor, further cause the processor to:

detect, via the computing system, the type of raw data is point cloud data, in response to receiving the raw data;

calculate, via the computing system, one or more raw lines from the point cloud data;
calculate, via the computing system, main guidelines based on the one or more raw lines;
calculate, via the computing system, a pivot point from one or more intersection points of the main guidelines;
identify, via the computing system, an orthogonal façade for the at least one structure;
identify, via the computing system, one or more rooms of the at least one structure based on the main guidelines, the pivot point and orthogonal façade;
generate, via the computing system, a visual representation of the one or more rooms of the at least on structure; and
display, via the computing system, on the display the visual representation of the one or more rooms of the at least one structure.

30. The non-transitory computer readable medium of claim 28, wherein the instructions, when executed by the processor, further cause the processor to:
detect, via the computing system, the type of raw data is point cloud data, in response to receiving the raw data;
extract, via the computing system, a main axis from the point cloud data;
create, via the computing system, a fine mesh horizontal grid including a plurality of cells;
assign, via the computing system, a value to each of the plurality of cells;
calculate, via the computing system, main guidelines;
calculate, via the computing system, corners based on one or more intersection points of one or more lines;
identify, via the computing system, one or more walls of the least one structure based on the calculated corners;
generate, via the computing system, a first floor plan of the at least one structure;
compare, via the computing system, a second floor plan to the first floor plan of the at least one structure; and
assign, via the computing system, a score to the second floor plan based on the comparison of the second floor plan and the first plan of the at least one structure.

31. The non-transitory computer readable medium of claim 28, wherein the instructions, when executed by the processor, further cause the processor to:
detect, via the computing system, the type of raw data is point cloud data captured at a first-person perspective view, in response to receiving the raw data;
receive, via the computing system, a user interaction on the display identifying at least one wall of the at least one structure in the point cloud data;
project, via the computing system, an infinite ray into the point cloud data;
determine, via the computing system, one or more intersection points of the infinite ray and the point cloud data;
execute, via the computing system, a region growing plane algorithm based on the one or more intersection points of the infinite ray and the point cloud data;
extract, via the computing system, at least one plane of the at least one wall in response to the execution of the region growing plane algorithm;
calculate, via the computing system, one or more intersection points of the at least one wall and at least one floor or at least one ceiling of the at least one structure;
construct, via the computing system, a floor contour or a polyhedron representing an assembly of at least one room of the at least one structure; and
display, via the computing system, on the display, the floor contour or the polyhedron.

32. The non-transitory computer readable medium of claim 26, wherein the instructions, when executed by the processor, further cause the processor to:
capture, via an image capturing device coupled to the input device, one or more images of a roof face of the at least one structure; and
transmit, via the input device, the one or more images of the roof face of the at least one structure.

33. The non-transitory computer readable medium of claim 32, wherein the instructions, when executed by the processor, further cause the processor to:
receive, via the computing system, the one or more images of the roof face of the at least one structure;
determine, via the computing system, a pixel size of the one or more images;
map, via the computing system, the one or more images to the reconstructed model of the at least one structure;
identify, via the computing system, one or more areas of damage in the one or more images; and
determine, via the computing system, an amount of the one or more areas of damage exceeds a predetermined threshold amount.

* * * * *

UNITED STATES PATENT AND TRADEMARK OFFICE
CERTIFICATE OF CORRECTION

| | | |
|---|---|---|
| PATENT NO. | : 11,734,468 B2 | |
| APPLICATION NO. | : 16/545607 | |
| DATED | : August 22, 2023 | |
| INVENTOR(S) | : Lewis et al. | |

It is certified that error appears in the above-identified patent and that said Letters Patent is hereby corrected as shown below:

On the Title Page

On Page 2, item (56) under the References Cited U.S. Patent Documents, Column 1, 2015/0116509, "Bidder et al" should be deleted and replaced with "Birkler et al.".

In the Claims

In Column 13, Line 57, Claim 9, the word "on" should be deleted and replaced with the word "one".

Signed and Sealed this
Twenty-sixth Day of March, 2024

Katherine Kelly Vidal
*Director of the United States Patent and Trademark Office*